(12) United States Patent
Tamaki

(10) Patent No.: US 9,392,162 B2
(45) Date of Patent: Jul. 12, 2016

(54) IMAGING APPARATUS AND ITS CONTROL METHOD

(71) Applicant: CANON KABUSHIKI KAISHA, Tokyo (JP)

(72) Inventor: Yoshihito Tamaki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/670,130

(22) Filed: Mar. 26, 2015

(65) Prior Publication Data

US 2015/0281558 A1    Oct. 1, 2015

(30) Foreign Application Priority Data

Mar. 28, 2014   (JP) ................................ 2014-067965
Mar. 11, 2015   (JP) ................................ 2015-048201

(51) Int. Cl.
| | |
|---|---|
| *H04N 5/232* | (2006.01) |
| *G02B 7/28* | (2006.01) |
| *H04N 5/369* | (2011.01) |
| *G03B 13/36* | (2006.01) |
| *H04N 101/00* | (2006.01) |

(52) U.S. Cl.
CPC .............. *H04N 5/23212* (2013.01); *G02B 7/28* (2013.01); *G03B 13/36* (2013.01); *H04N 5/3696* (2013.01); *H04N 2101/00* (2013.01)

(58) Field of Classification Search
CPC ............ G03B 13/36; G02B 7/28; G02B 7/34; H04N 5/23212; H04N 5/3696
See application file for complete search history.

(56) References Cited

U.S. PATENT DOCUMENTS

| 6,829,008 B1 | 12/2004 | Kondo et al. | |
|---|---|---|---|
| 2014/0146221 A1 | 5/2014 | Kimura et al. | |
| 2015/0256778 A1* | 9/2015 | Kusaka | G03B 13/36 |
| | | | 348/302 |

FOREIGN PATENT DOCUMENTS

| JP | 3592147 B2 | 11/2004 |
|---|---|---|
| JP | 2013-025246 A | 2/2013 |
| JP | 5274299 B2 | 8/2013 |

* cited by examiner

*Primary Examiner* — Paul Berardesca
(74) *Attorney, Agent, or Firm* — Cowan, Liebowitz & Latman, P.C.

(57) ABSTRACT

An imaging apparatus includes an imaging element with a first pixel for receiving light flux passing through a first partial pupil area in a focusing optical system and a second pixel for receiving the light flux passing through the entire pupil area in a focusing optical system. A signal generating unit of a focus detection signal generates a first signal based on a light-receiving signal of the first pixel and a second signal based on a light-receiving signal of the second pixel. A control unit performs shift processing for the first signal and the second signal in a second focus detection (S200) following a first focus detection of a phase difference type (S100), and then, sums the shift-processed signals to generate a shift summation signal for a plurality of shift amounts. The control unit calculates a contrast evaluation value from the magnitude of the generated shift summation signal and acquires a defocus amount to control the focus adjustment operation of the focusing optical system.

11 Claims, 16 Drawing Sheets

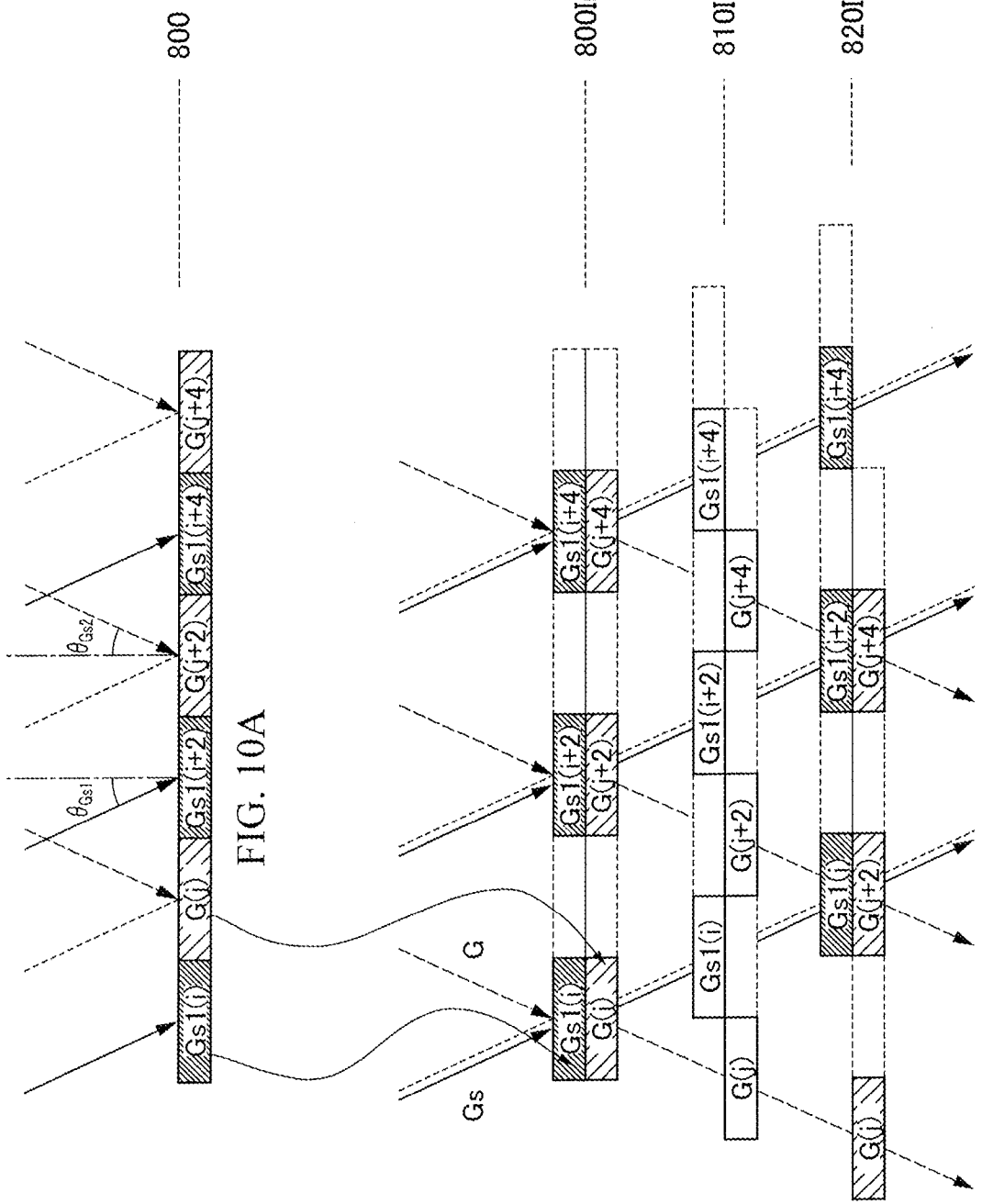

IMAGING APPARATUS AND ITS CONTROL METHOD

BACKGROUND OF THE INVENTION

1. Field of the Invention

The present invention relates to an imaging apparatus and a control method for the same, and relates in particular to an auto focus (hereinafter abbreviated as "AF") control based on a photoelectric conversion signal output from an imaging element.

2. Description of the Related Art

One focus detection method performed by an imaging apparatus is an imaging plane phase-difference type method that detects a focus state using focus detecting pixels formed in an imaging element. Another focus detection method performed by an imaging apparatus is a contrast type method that detects a focus state using a contrast evaluation value based on a shot imaging signal output from an imaging element.

Japanese Patent Laid-Open No. 2013-025246 discloses an imaging plane phase-difference type imaging apparatus that includes a contrast evaluating unit and a correlation calculating unit, and compares two absolute values of focus evaluation ranges obtained from these units to thereby determine the focus evaluation value of an object based on the comparison result. The contrast evaluating unit determines a contrast focus position based on the contrast evaluation value of a signal obtained by shift summation of imaging signals from different pupil areas. Thus, a focus position can be specified without actually driving a focus lens for AF control.

Japanese Patent No. 3592147 discloses a solid-state image pickup device in which photoelectric conversion cells for converting an optical image formed by an optical system into an electrical signal are two-dimensionally laid out, and at least part of the photoelectric conversion cell group is configured to output a signal for distance measurement.

Japanese Patent No. 5274299 discloses a technique for calculating the focus state (defocus amount) of the shooting lens by using a first image obtained from focus detecting pixels and a second image obtained from imaging pixels, while reducing the degree of the degradation of the image quality.

However, Japanese Patent Laid-Open No. 2013-025246 does not describe an imaging element that two-dimensionally lays out pixels, which allows a relative position between a microlens and a photoelectric conversion unit to be biased, as disclosed in Japanese Patent No. 3592147. If the focus detection of the contrast evaluating unit in Japanese Patent Laid-Open No. 2013-025246 is performed with the imaging element disclosed in Japanese Patent No. 3592147, the precision for the focus detection is reduced because a pair of focus detecting pixels is spatially spaced apart from each other.

Also, the device disclosed in Japanese Patent No. 5274299 detects the defocus amount based on the difference of the center of the gravity between the first image obtained from the focus detecting pixels and the second image obtained from imaging pixels. Therefore, the precision of the focus detection is reduced compared to the focus detection of the contrast evaluating unit as disclosed in Japanese Patent Laid-Open No. 2013-025246.

SUMMARY OF THE INVENTION

The present invention provides an imaging apparatus using an imaging element with a plurality of pixels for receiving light flux passing through pupil areas different from each other in a focusing optical system to enable detecting a focus with high precision by a focus detection sequence based on a contrast evaluation value.

According to the present invention, an imaging apparatus is provided that includes: an imaging element with a first pixel for receiving light flux passing through a partial pupil area in a focusing optical system and a second pixel for receiving the light flux passing through a pupil area that includes the partial pupil area; a signal generating unit configured to generate a first signal based on a signal received by the first pixel and generate a second signal based on a signal received by the second pixel; and a controlling unit configured to a control focus adjustment operation of the focusing optical system by using the first signal and the second signal. The controlling unit calculates a contrast evaluation value determined based on a shift summation signal obtained by performing shift processing for the first signal and the second signal, and summing the shift-processed first signal and the second signal for a plurality of shift amounts, and controls the focus adjustment operation by using a detection amount determined based on the contrast evaluation value.

Further features of the present invention will become apparent from the following description of exemplary embodiments with reference to the attached drawings.

BRIEF DESCRIPTION OF THE DRAWINGS

FIGS. 10A to 10B are schematic views illustrating refocus processing.

DESCRIPTION OF THE EMBODIMENTS

Hereinafter, preferred embodiments of the present invention will be described in detail with reference to the accompanying drawings.

First Embodiment

Figure 1:
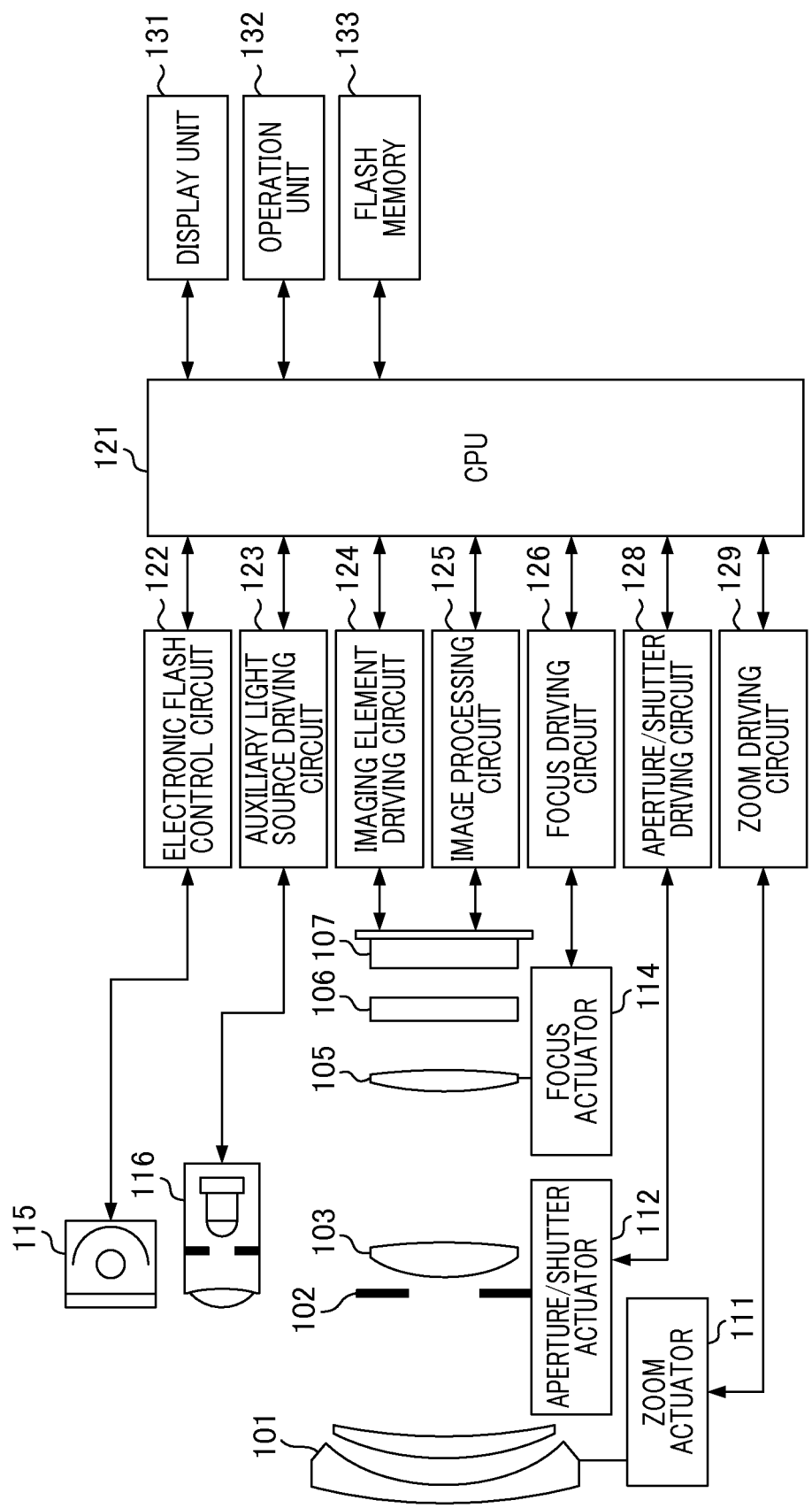
FIG. 1 is a schematic block view illustrating an example of a configuration of an imaging apparatus in order to explain a first embodiment of the present invention in conjunction with FIGS. 2 to 15.

FIG. 1 is a block view illustrating an example of a configuration of an imaging apparatus according to a first embodiment of the present invention. A first lens group 101, which is arranged at a distal end of an imaging optical system (focusing optical system), is held so as to be extendable and retractable in an optical axis direction in a lens barrel. An aperture shutter 102 adjusts the aperture diameter to adjust light quantity when shooting. The aperture shutter 102 also functions as a shutter for adjusting an exposure time when shooting a still image. The aperture shutter 102 and a second lens group 103 advance and retract together in the optical axis direction to achieve a zooming function by a magnification-varying operation in synchronism with the reciprocal operation of the first lens group 101. A third lens group 105 is a focus lens for focusing by advancing and retracting in the optical axis direction. An optical low-pass filter 106 is an optical element for reducing the false color or moiré of a shot image. An imaging element 107, for example, consists of a two-dimensional CMOS (Complementary Metal Oxide Semiconductor) photo sensor and its peripheral circuit, and is arranged on the imaging plane of the imaging optical system.

A zoom actuator 111 performs the magnification-varying operation by rotating a cam cylinder (not shown) to cause the first lens group 101 and the second lens group 103 to move in the optical axis direction. An aperture/shutter actuator 112 controls the aperture diameter of the aperture shutter 102 to adjust the light quantity, and controls the exposure time when shooting the still image. A focus actuator 114 performs focus adjustment operation by moving the third lens group 105 in the optical axis direction.

An electronic flash 115 is used to illuminate an object when shooting. The electronic flash 115 is preferably a flash illumination device using a xenon tube but may also be an illumination device having a continuous emission LED (Light Emitting Diode). An AF auxiliary light source 116 improves a focus detection capability for a low-brightness object or low-contrast object. The AF auxiliary light source 116 projects an image of a mask having a predetermined aperture pattern to the field via a projection lens.

A CPU (Central Processing Unit) 121 which constitutes a control unit of a camera system has a control central function that carries out various types of control. The CPU 121 includes an arithmetic unit, a ROM (Read Only Memory), a RAM (Random Access Memory), an A (Analog)/D (digital) converter, a D/A converter, a communication interface circuit, and the like. The CPU 121 drives various circuits incorporated into the camera on the basis of a predetermined program stored in the ROM to execute a series of operations including AF control, shooting, image processing, record processing, and the like. In the present embodiment, the CPU 121 controls signal generating processing, focus detection processing, image generating processing, and the like.

An electronic flash control circuit 122 controls the ON operation of the electronic flash 115 in synchronism with the shooting operation in accordance with the control command of the CPU 121. An auxiliary light source driving circuit 123 controls the ON operation of the AF auxiliary light unit 116 in synchronism with the focus detection operation in accordance with the control command of the CPU 121. An imaging element driving circuit 124 controls the imaging operation of the imaging element 107, A/D-converts an acquired imaging signal, and transits the digital data to the CPU 121. According to the control command of the CPU 121, an image processing circuit 125 performs processes such as γ conversion, color interpolation, JPEG (Joint Photographic Experts Group) compression, and the like for an image obtained by the imaging element 107.

A focus driving circuit 126 carries out control to drive the focus actuator 114 on the basis of the focus detection result in accordance with the control command of the CPU 121, and move the third lens group 105 in the optical axis direction, thereby adjusting the focus. An aperture/shutter driving circuit 128 carries out control to drive the aperture/shutter actuator 112 in accordance with the control command of the CPU 121, whereby the aperture diameter of the aperture shutter 102 is controlled. A zoom driving circuit 129 drives the zoom actuator 111 in accordance with the zooming operation instruction of the photographer in accordance with the control command of the CPU 121.

A display unit 131 has a display device such as an LCD (Liquid Crystal Display) or the like, and displays information on the shooting mode of the camera, a preview image before shooting, a confirmation image after shooting, an in-focus display image upon focus detection, and the like. An operation unit 132 includes a power switch, a release (shooting trigger) switch, a zooming operation switch, a shooting mode selection switch, and the like as operation switches, and outputs an operation instruction signal to the CPU 121. A flash memory 133 is a storage medium that is removable from a camera main body and that records shot image data or the like.

Figure 2:
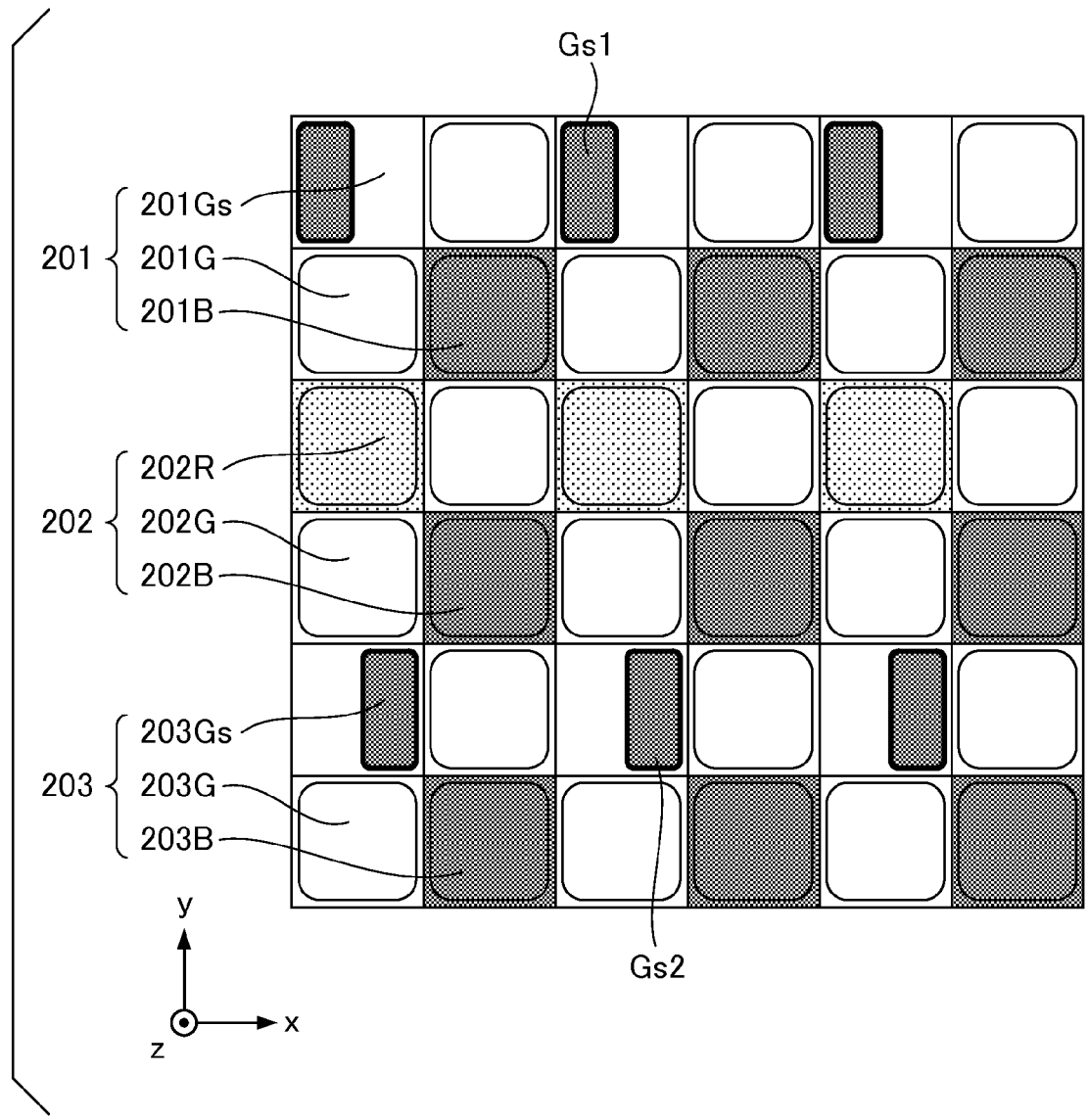
FIG. 2 is a schematic view illustrating a pixel array of an imaging element.

Next, with reference to FIG. 2, a description will be given of an array of an imaging pixel and a focus detecting pixel formed on an imaging element according to the present embodiment. FIG. 2 illustrates an imaging pixel array in a 6-column by 6-row range, including the imaging pixels and the focus detecting pixels of a two-dimensional CMOS sensor (imaging element). In the present embodiment, the imaging pixel for generating the imaging signal is set as a second pixel, and a plurality of focus detecting pixels are set as a first pixel and a third pixel. In the present embodiment, the imaging pixel is a pixel mainly used as a signal for image recording, and the focus detecting pixel is a pixel mainly used in the focus detection processing, and receives light flux from the pupil area that is limited by the imaging pixel. However, the use of each pixel is not necessarily limited. In the present embodiment, the imaging signal obtained from the imaging pixel of the imaging element 107 by the imaging (shooting) is used in the recording image recorded in the storage medium such as the flash memory 133 after the processing by the image processing circuit 125 and the like. During the processing, the recording signal corresponding to the pixel position where the focus detecting pixel is arranged is generated by using the signal from the imaging pixel (the focus detecting pixel as necessary) close to the position to be interpolated and the like. Note that in FIG. 2, the z direction is set in a direction perpendicular to the sheet surface, and the x direction is set in a horizontal direction orthogonal to the z-direction, and the y direction is set in a vertical direction orthogonal to the z-direction.

A focus detecting pixel 201Gs having a spectral sensitivity of G (Green) is placed at upper left of a 2-column by 2-row pixel group 201, and a detection unit is biased to the left side of FIG. 2 compared to the center of the pixels. Two pixels 201G having the spectral sensitivity of G (Green) are respectively placed at the upper right and lower left of the 2-column by 2-row pixel group 201, and a pixel 200B having a spectral sensitivity of B (Blue) is placed at the lower right of the 2-column by 2-row pixel group 201. Also, a focus detecting pixel 203Gs having the spectral sensitivity of G (Green) is placed at upper left of a 2-column by 2-row pixel group 203 and the detection unit is biased to the right side of FIG. 2 compared to the center of the pixels. The two pixels 203G having the spectral sensitivity of G (Green) are respectively placed at the upper right and the lower left of the 2-column by 2-row pixel group 203, and a pixel 203B having the spectral sensitivity of B (Blue) is placed at the lower right of the 2-column by 2-row pixel group 203. Note that, in the present embodiment, although a description will be given of an example that describes the focus detecting image pixel with the spectral sensitivity of G (Green) at the upper left of the 2-column by 2-row pixel group, a transparent film may be used instead of a G (green) filter. In a 2-column by 2-row pixel group 202, a pixel 202R having a spectral sensitivity of R (Red) is placed at the upper left side. Two pixels 202 having the spectral sensitivity of G (Green) are respectively placed at the upper right and the lower left of the 2-column by 2-row pixel group 202, and a pixel 202B having the spectral sensitivity of B (Blue) is placed at the lower right of the 2-column by 2-row pixel group 202.

A number of a pixel group, such as the 2-column by g-row pixel group 201 to 203 as shown in FIG. 2, is placed on the X-Y plane, whereby a shot image signal (second signal) and focus detection signals (first signal and third signal) can be obtained.

Figure 3B:
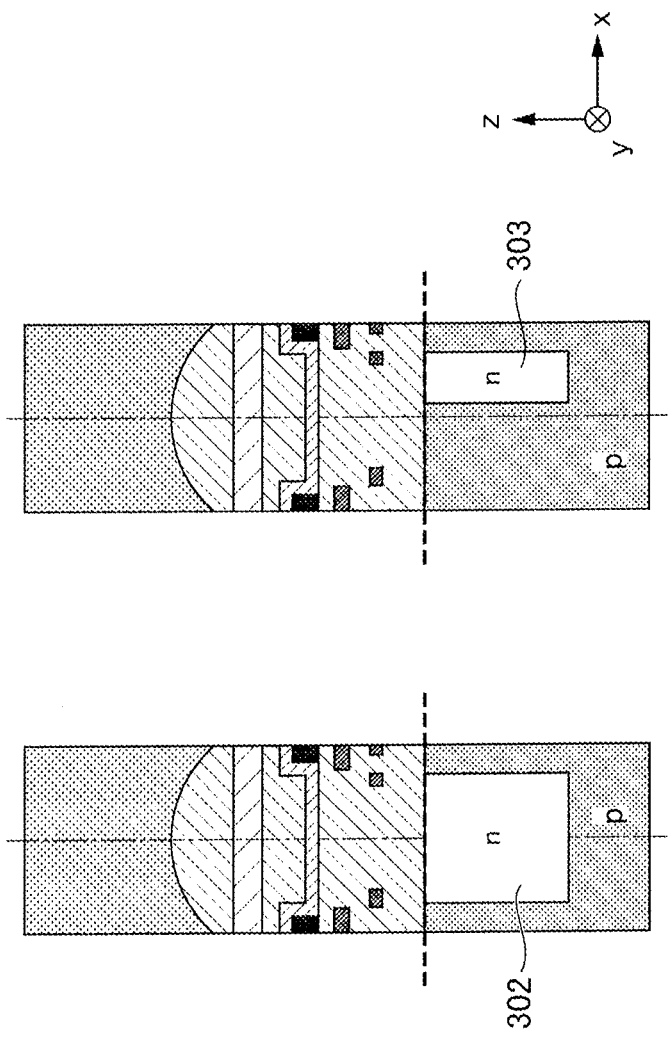
FIG. 3B is a schematic cross-sectional view illustrating the pixel.
Figure 3A:
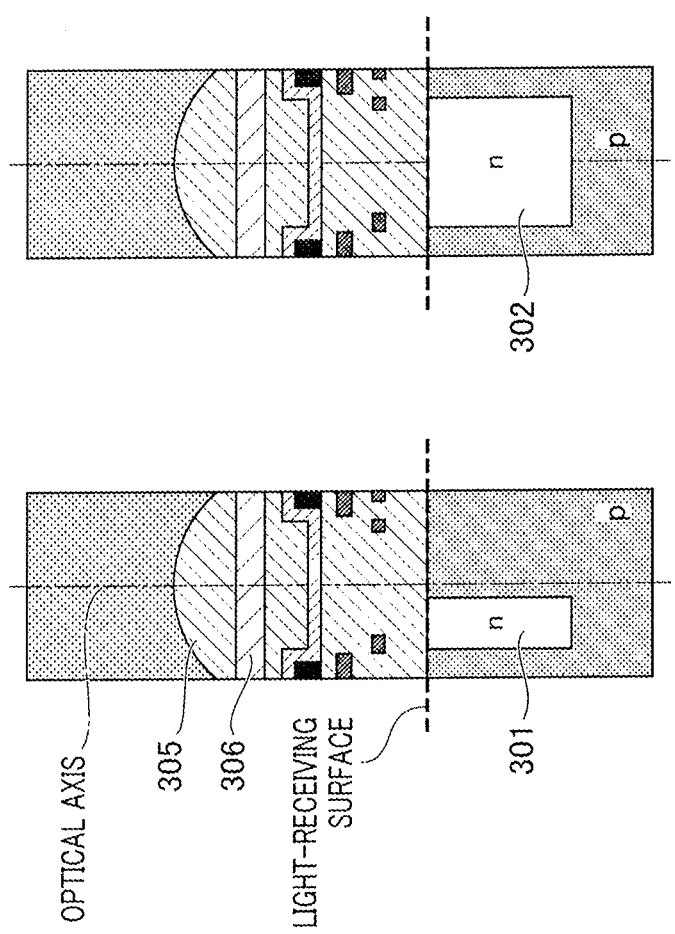
FIG. 3A is a schematic plan view illustrating a pixel.

FIG. 2 illustrates a pixel array of a second pixel R, G, B that is an imaging pixel, and a first pixel Gs1 and a third pixel Gs2 that are focus detecting pixels. Referring to FIG. 3, a description will be given of structures of each of the pixels. FIG. 3A illustrates plan views as viewed from the light-receiving surface side (+z side) of the imaging element. In FIG. 3A, the z-direction is set in a direction perpendicular to the sheet, the x direction is set in a horizontal direction orthogonal to the z-direction, and the y direction is set in a perpendicular direction orthogonal to the z-direction. Also, FIG. 3B illustrates cross-sectional views of an a-a cross-sectional surface, a b-b cross-sectional surface, and a c-c cross-sectional surface of FIG. 3A, as viewed from the ⁻y direction. In FIG. 3B, the y direction is set in a direction perpendicular to the sheet, the x direction is set in a horizontal direction orthogonal to the y direction, and the z direction is set in a perpendicular direction orthogonal to the y direction. From the left side, FIG. 3 illustrates the first pixel Gs1 that is the focus detecting pixel, the second pixel R, G, B that is the imaging element, and the third pixel Gs2 that is the focus detecting pixel. In the description of the present embodiment, each light-receiving unit of the first pixel Gs1 and the third pixel Gs2 has an area that is half the light-receiving unit of the second pixel R, G, B. Note that, these pixels may be a plurality of pixels having a light-receiving unit with less area than any unit as described above.

As shown on the left side of FIG. 3, in the first pixel Gs1, a microlens 305 for condensing incident light is formed on the light-receiving side, and a photoelectric conversion unit 301 biased in −x direction is formed. Also, as shown in the middle of FIG. 3, in the second pixel R, G, B, the microlens 305 for condensing the incident light is formed on the light-receiving side of each pixel, and a photoelectric conversion unit 302 is formed. Also, as shown on the right side of FIG. 3, in the third pixel Gs2, the microlens 305 for condensing the incident light is formed on the light-receiving side, and a photoelectric conversion unit 303 biased in +x direction is formed. A color filter 306 is formed between the microlens (305) and each of photoelectric conversion units (301, 302, 303) in each pixel. Alternatively, the spectrum transmissivity of the color filter may be changed for each focus detecting pixel, or the color filter may be omitted, if required.

Light incident to the first pixel Gs1 as shown on the left side of FIG. 3 is condensed by the microlens 305, dispersed by the color filter 306, and then received by the photoelectric conversion unit 301. Light respectively incident to the second pixel R, G, B as shown in the middle of FIG. 3 is condensed by the microlens 305, dispersed by the color filter 306, and then received by the photoelectric conversion unit 302. Light incident to the third pixel Gs2 as shown in the right side of FIG. 3 is condensed by the microlens 305, dispersed by the color filter 306, and then received by the photoelectric conversion unit 303.

In each photoelectric conversion unit, an electron and a hole (positive hole) are generated through pair production according to the amount of light received and separated by a depletion layer, and thereafter, electrons having a negative charge are accumulated in an n-type layer (not shown), and the hole is discharged outside the imaging element through a p-type layer connected to a constant voltage source (not shown). Electrons accumulated in the n-type layer (not shown) of each photoelectric conversion unit are transferred to a capacitance unit (FD) via a transfer gate and then converted into a voltage signal.

Referring to a schematic explanatory view of FIG. 4, a description will be given of a correspondence relationship between the pixel structure as shown in FIG. 3 and pupil division. FIG. 4 illustrates cross-sectional views as viewed from +y direction and of the a-a cross-sectional surface of the focus detecting pixel (first pixel), the b-b cross-sectional surface of the imaging element (second pixel), and the c-c cross-sectional surface of the focus detecting pixel (third pixel), and exit pupil planes of a focusing optical system. In FIG. 4, in order to make a correspondence to a coordinate axis of the exit pupil plane, the x and y axes in the cross-sectional views are reversed with respect to FIG. 3. Also, in the coordinate axis of the exit pupil plane shown in the upper side of FIG. 4, the z direction is set as a direction perpendicular to the sheet surface, the x direction is set in a horizontal direction orthogonal to the z direction, and the y direction is set in a vertical direction orthogonal to the z direction.

Figure 4A:
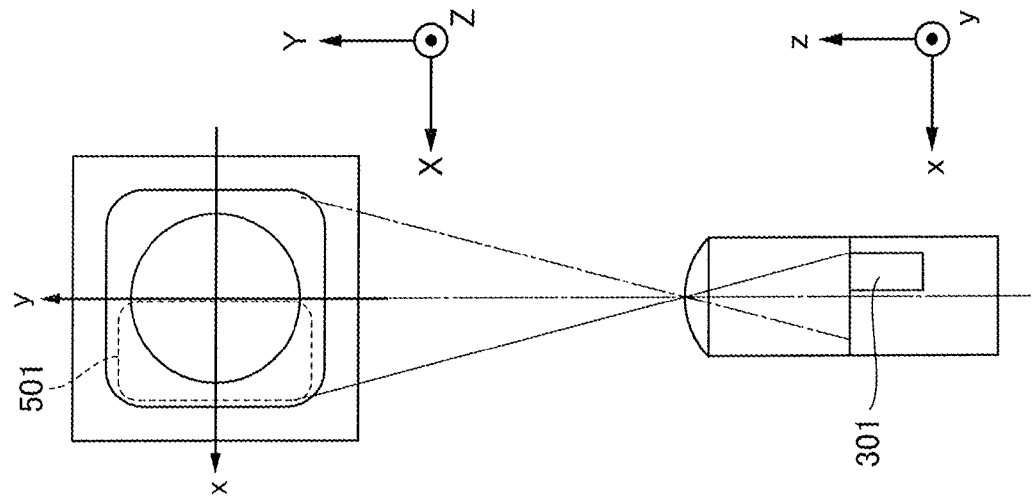
FIGS. 4A to 4C are schematic views illustrating a correspondence relationship between the pixel and pupil division.
Figure 4B:
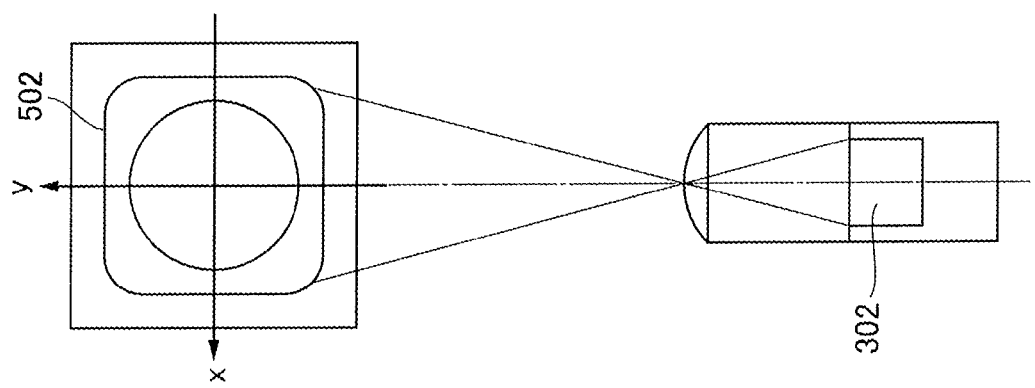
Figure 4C:
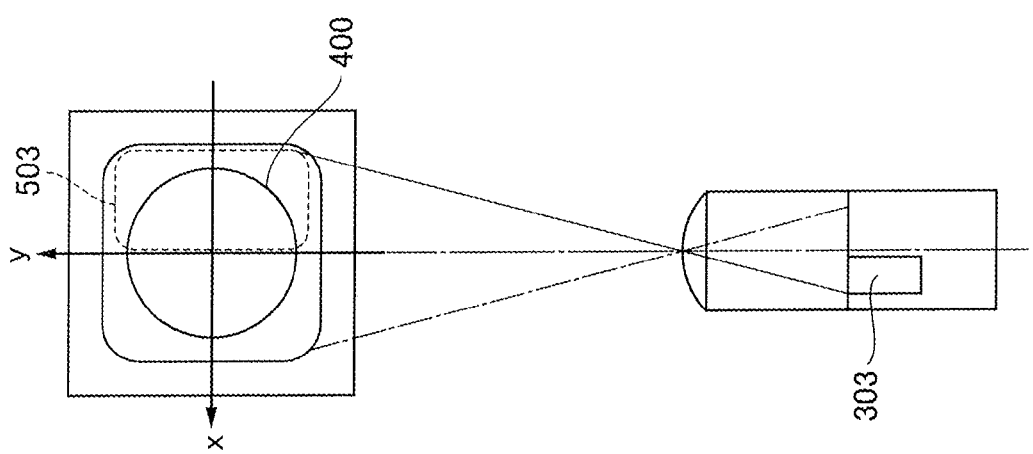

As shown in FIG. 4C, by the microlens, a first partial pupil area 501 corresponding to the first pixel Gs1 has a substantially conjugating relationship with the light-receiving surface of the photoelectric conversion unit 301, of which the center of gravity is biased to the −x direction. In other words, the first partial pupil area 501 represents a pupil area that can receive light over the first pixel Gs1 and of which the center of gravity is eccentric in the +x direction on the pupil plane.

As shown in FIG. 4B, by the microlens, a pupil area 502 corresponding to the second pixel R, G, B has a substantially conjugate relationship with the light-receiving surface of the photoelectric conversion unit 302. In other words, the pupil area 502 represents a pupil area that can receive light over the second pixel R, G, B.

As shown in FIG. 4A, by the microlens, a second partial pupil area 503 corresponding to the third pixel Gs2 has a substantially conjugating relationship with the light-receiving surface of the photoelectric conversion unit 303, of which the center of gravity is biased to the +x direction. In other words, the second partial pupil area 503 represents a pupil area that can receive light over the third pixel Gs2 and of which the center of gravity is eccentric in the −x direction on the pupil plane.

Figure 5A:
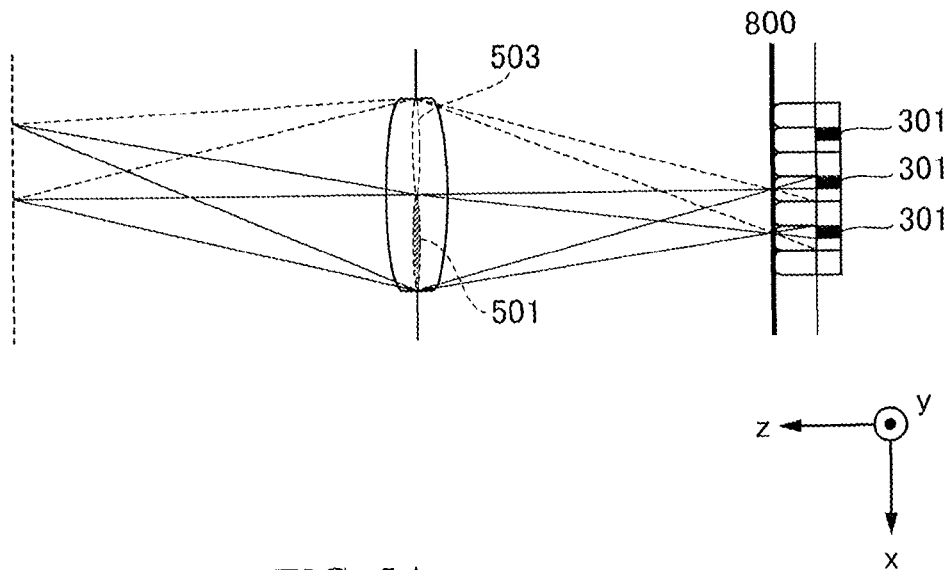
FIG. 5A is a schematic view illustrating the correspondence relationship between a focus detecting pixel and the pupil division.

FIG. 5A illustrates a schematic view illustrating the correspondence relationship between the first pixel Gs1 that is the focus detecting pixel and the pupil division. In FIG. 5A, the y direction is set in a direction perpendicular to the sheet surface, and the z direction is set in a horizontal direction orthogonal to the y direction, and the x direction is defined in a vertical direction orthogonal to the y direction.

The light flux passing through the first partial pupil area 501 is respectively incident to each pixel of the imaging elements at different angles and received by the first pixel Gs1. In the present embodiment, the focus detecting pixel is divided into pupil areas different from each other in the horizontal direction. The imaging element has a structure that arrays a plurality of the following first to third pixels:

The first pixel: a focus detecting pixel for receiving light flux passing through the first partial pupil area 501 of the focusing optical system;

The second pixel: an imaging element for receiving all the light flux passing through the pupil area in the focusing optical system;

The third pixel: a focus detecting pixel for receiving light flux passing through the second partial pupil area 503 of the focusing optical system different from the first partial pupil area 501.

In the present embodiment, a light-receiving signal of the first pixel Gs1, which is the focus detecting pixel, is aggregated to thereby generate the first signal and the light-receiving signal of the second pixel R, G, B that is the imaging pixel is aggregated to thereby generate the second signal, thereby detecting the focus. Alternatively, the third signal generated by aggregating the light-receiving signal of the third pixel Gs2 instead of the first pixel Gs1 may be used. Also, when the second signal of the second pixel R, G, B, which is the imaging element, and the first pixel Gs1 and the third pixel Gs2, which are the focus detecting pixels, are respectively interpolated to calculate an interpolated signal, an imaging signal (image) having a resolution corresponding to the number of effective pixels N is generated by using the interpolated signal.

Figure 5B:
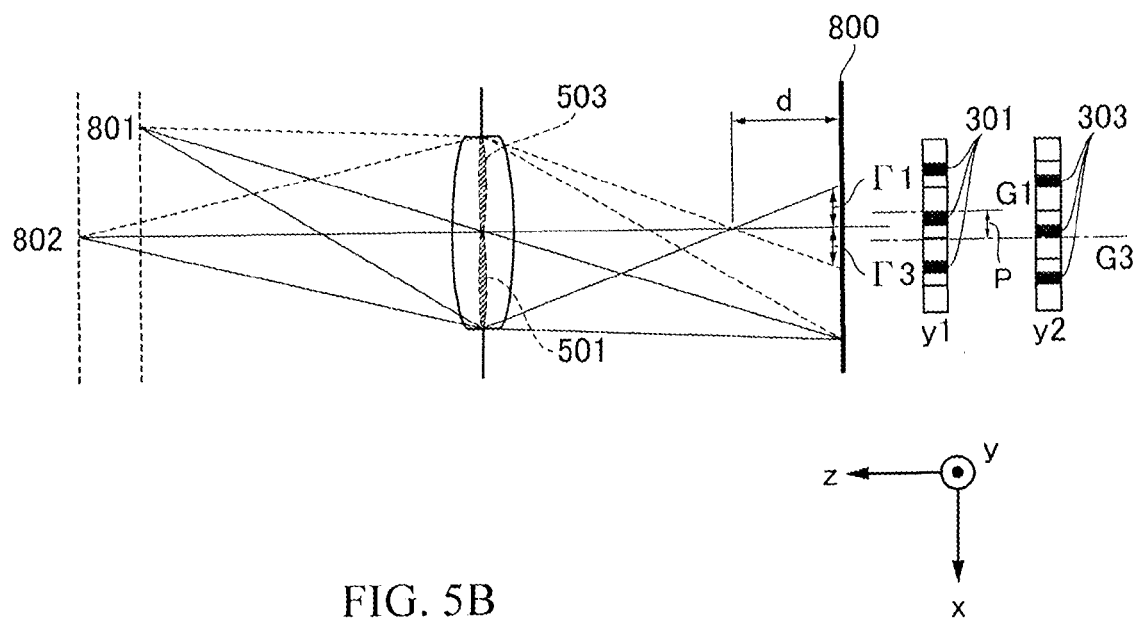
FIG. 5B is a schematic view illustrating a relationship between a defocus amount between a first signal and a third signal and an image shift amount therebetween.

Next, a description will be given of a relationship of the defocus amount between the first signal and the third signal and the image shift amount therebetween. FIG. 5B is a schematic view illustrating the relationship between the defocus amount between the first signal and the third signal and the image shift amount therebetween. In FIG. 5B, the y direction is set in a direction perpendicular to the sheet surface, and the z direction is set in a horizontal direction orthogonal to the y-direction, and the x direction is defined in a vertical direction orthogonal to the y direction.

The imaging element is arrayed in an imaging plane 800 and the exit pupil of the focusing optical system is divided into the first partial pupil area 501 and the second partial pupil area 503, as in FIG. 4 and FIG. 5A. The first pixel Gs1 receives light from the first partial pupil area 501 and the third pixel Gs2 receives light from the second partial pupil area 503. FIG. 5B illustrates a pixel row y1, including the first pixel Gs1, and a pixel row y2, including the third pixel Gs2, in the imaging element.

In the defocus amount (referred to as "d"), the distance from an imaging position of an object to the imaging plane 800 is denoted by a magnitude |d|. The defocus amount d is defined such that a front focus state in which the imaging position of the object image is on the object side compared to the imaging plane 800 is negative (d<0), and a rear focus state, in which the imaging position of the object image is the opposite to that of the front focus state, is positive (d>0). In an in-focus state in which the imaging position of the object image is on the imaging plane (in-focus position), d is null (d=0).

In FIG. 5B, the position of an object 801 shows a position corresponding to the in-focus state (d=0), and the position of an object 802 shows a position corresponding to the front focus state (d<0). Hereinafter, the front focus state (d<0) and the rear focus state (d>0) are collectively referred to as a "defocus state (|d|>0)".

In the front focus state (d<0), light flux passed through the first partial pupil area 501 (or the second partial pupil area 503) among light from the object 802 is temporarily converged, and then spreads with the width Γ1 (or Γ3) about a position G1 (or G3) of the center of gravity of the light flux as a center. In this case, a blurred image is formed on the imaging plane 800. The blurred image receives light from the first pixel Gs1 (or the third pixel Gs2) arrayed on the imaging element to thereby generate the first signal (or the third signal). Thus, the first signal (or the third signal) is detected as an object image (blurred image) having the width Γ1 (or Γ3) at the position G1 (or G3) of the center of gravity on the imaging plane 800. The width Γ1 (or Γ3) of the object image substantially increases in proportion to an increase in the magnitude |d| of the defocus amount d. Likewise, if the image shift amount of the object image between the first signal and the third signal is denoted by "p", the magnitude |p| thereof increases in proportion to an increase in the magnitude |d| of the defocus amount d. For example, the image shift amount p is defined as the difference "G1-G3" between the positions G1 and G3 of the center of gravity of the light flux, and the magnitude |p| thereof substantially increases in proportion to an increase in |d|. In the rear focus state (d>0), although the image shift direction of the object image between the first signal and the third signal is opposite to that in the front focus state, the magnitude |p| similarly increases. Accordingly, in the present embodiment, the magnitude of the image shift amount between the first signal and the second signal or that between the first signal and the third signal increases in proportion to an increase in the magnitude of the defocus amount of the imaging signal obtained by the summation of the first signal and the second signal or the first signal and the third signal.

In the present embodiment, the following two types of the focus detection are performed:

first focus detection: focus detection as a phase-difference method by using the relationship of the defocus amount between the first signal and the third signal, and the image shift amount therebetween.

second focus detection: focus detection as a method based on the refocus principle by using the relationship of the defocus amount between the first signal and the second signal and the image shift amount therebetween (hereinafter, referred to as a "refocus type").

Also, in the present embodiment, a first focus detecting unit is used to perform focus adjustment in a range from a first state (large-defocus state with a large-defocus amount) to a second state (small-defocus state with a small-defocus amount) in the focusing optical system. Furthermore, a second focus detecting unit is used to perform the focus adjustment in a range from the small-defocus state to the vicinity of the best in-focus position. However, the above combination does not intend to limit the present embodiment as the method utilized for each focus detection.

Firstly, a description will be given of the first focus detection as an imaging plane phase-difference type method.

In the first focus detection, a correlation amount (first evaluation value) representing a degree of the match between the first signal and the third signal by relatively shifting the signals is calculated, and the image shift amount is detected based on the shift amount at which correlation (the degree of match between the signals) increases. From the relationship in which the magnitude of the image shift amount between the first signal and the third signal increases in proportion to an increase in the magnitude of the defocus amount of the imaging signal, the image shift amount is converted into a first detection defocus amount to perform the focus detection.

Figure 6:
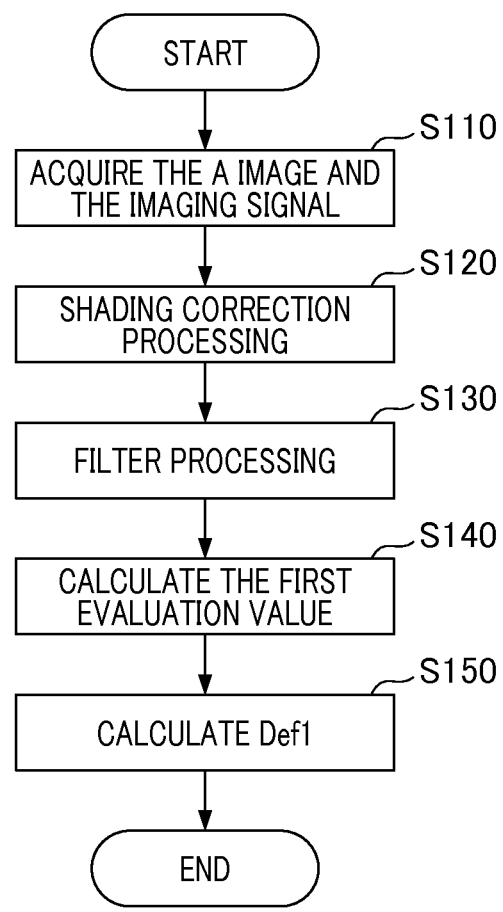
FIG. 6 is a flowchart illustrating first focus detection processing.

Referring to FIG. 6, a description will be given of a flow of a first focus detection processing. The present processing is performed by a focus detection signal generating unit, which is realized by controlling the imaging element 107 and the image processing circuit 125 in accordance with the program executed by the CPU 121.

In S110, processing for setting a focus detection area that performs focus adjustment from an effective pixel area of the imaging element is performed. In the focus detection area, the focus detection signal generating unit generates a first signal from the light-receiving signal (image-A signal) of the first pixel, and generates a third signal from the light-receiving signal (image-B signal) of the third pixel.

Figure 7:
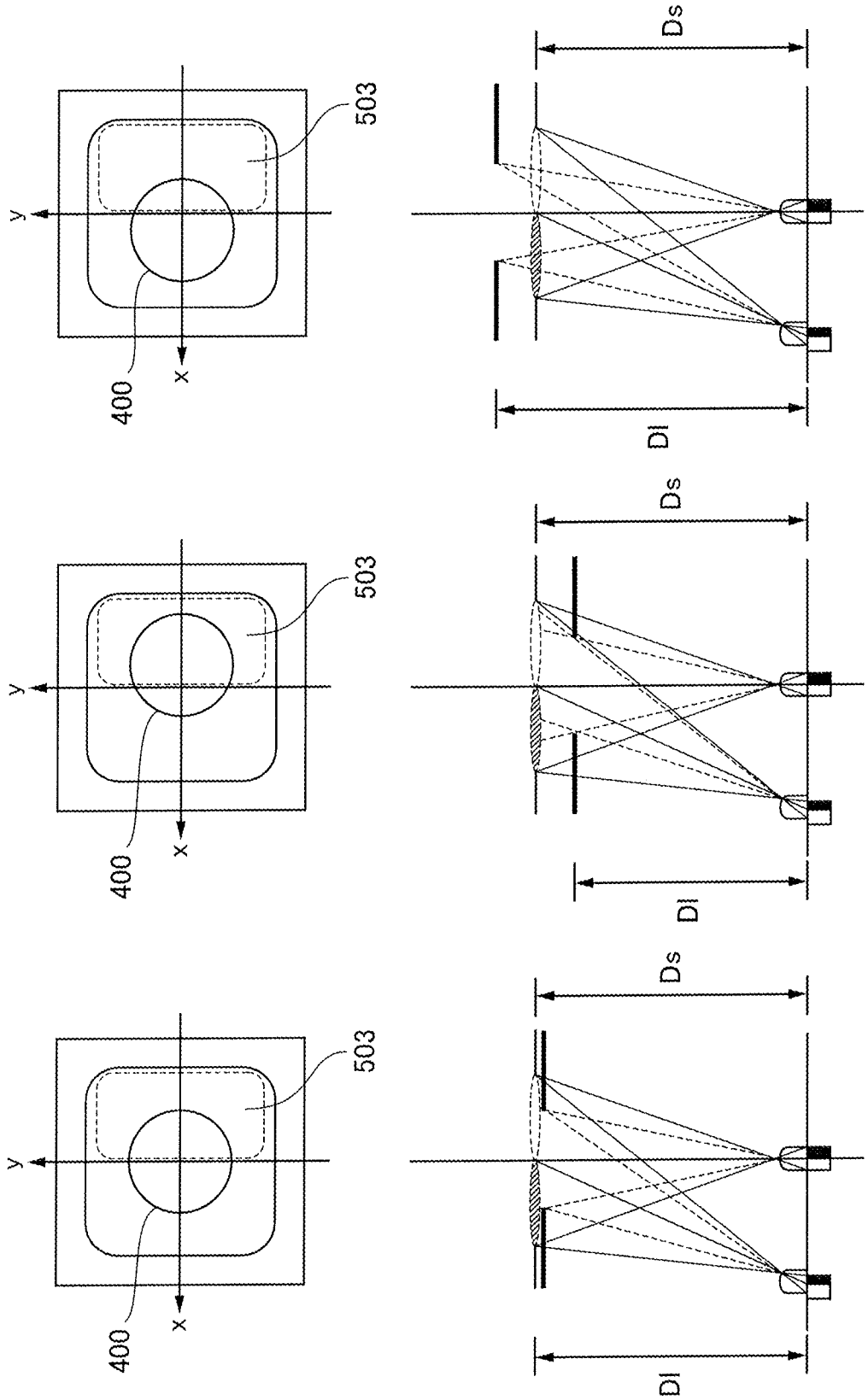
FIGS. 7A to 7C are schematic explanatory views each illustrating shading caused by a pupil shift between the first signal and the third signal.

In step S120, shading correction processing (optical correction processing) is performed for each of the first signal and the third signal. Referring to FIG. 7, a description will be given of the shading caused by the pupil shift of the third signal (or the first signal). FIG. 7 illustrates a relationship between the second partial pupil area 503 of the third pixel Gs2 at the peripheral image height of the imaging element and an exit pupil 400 of the focusing optical system.

FIG. 7A shows the case where the exit pupil distance Dl of the focusing optical system is the same as the set pupil distance Ds of the imaging element. In this case, the exit pupil 400 of the focusing optical system is substantially evenly divided by the second partial pupil area 503. In contrast, FIG. 7B shows the case where the exit pupil distance Dl of the focusing optical system is shorter than the set pupil distance Ds of the imaging element. In this case, a pupil shift occurs between the exit pupil of the focusing optical system and an entrance pupil of the imaging element at the peripheral image height of the imaging element, so that the exit pupil 400 of the focusing optical system is unevenly divided. Also, FIG. 7C shows the case where the exit pupil distance Dl of the focusing optical system is longer than the set pupil distance Ds of the imaging element. In this case, a pupil shift occurs between the exit pupil of the focusing optical system and the entrance pupil of the imaging element at the peripheral image height of the imaging element, so that the exit pupil 400 of the focusing optical system is unevenly divided. Uneven division of the pupil occurs at the peripheral image height, so that the intensity of the third signal becomes uneven. Consequently, shading occurs such that an intensity of one of the first signal and the third signal becomes relatively larger than that of the other one.

In step S120 in FIG. 6, a first shading correction coefficient of the first signal and a third shading correction coefficient of the third signal is respectively generated in accordance with the image height of the focus detection area, an F-number of the imaging lens (focusing optical system), and the exit pupil distance. In other words, the shading correction processing (optical correction processing) of the first signal and the third signal is executed by multiplying the first shading correction coefficient by the first signal and by multiplying the third shading correction coefficient by the third signal.

In the first focus detection of the phase difference type, the first defocus amount (hereinafter, referred to as a first detection amount and denoted by DEF1) is detected based on the correlation between the first signal and the third signal (degree of match between the signals). If the shading occurs caused by the pupil shift, the correlation between the first signal and the third signal (degree of match between the signals) can be reduced. Accordingly, in the first focus detection of the phase difference type, the shading correction processing (optical correction processing) is performed to improve the correlation between the first signal and the third signal (degree of match between the signals) and obtain the improved performance of the focus detection.

Figure 8:
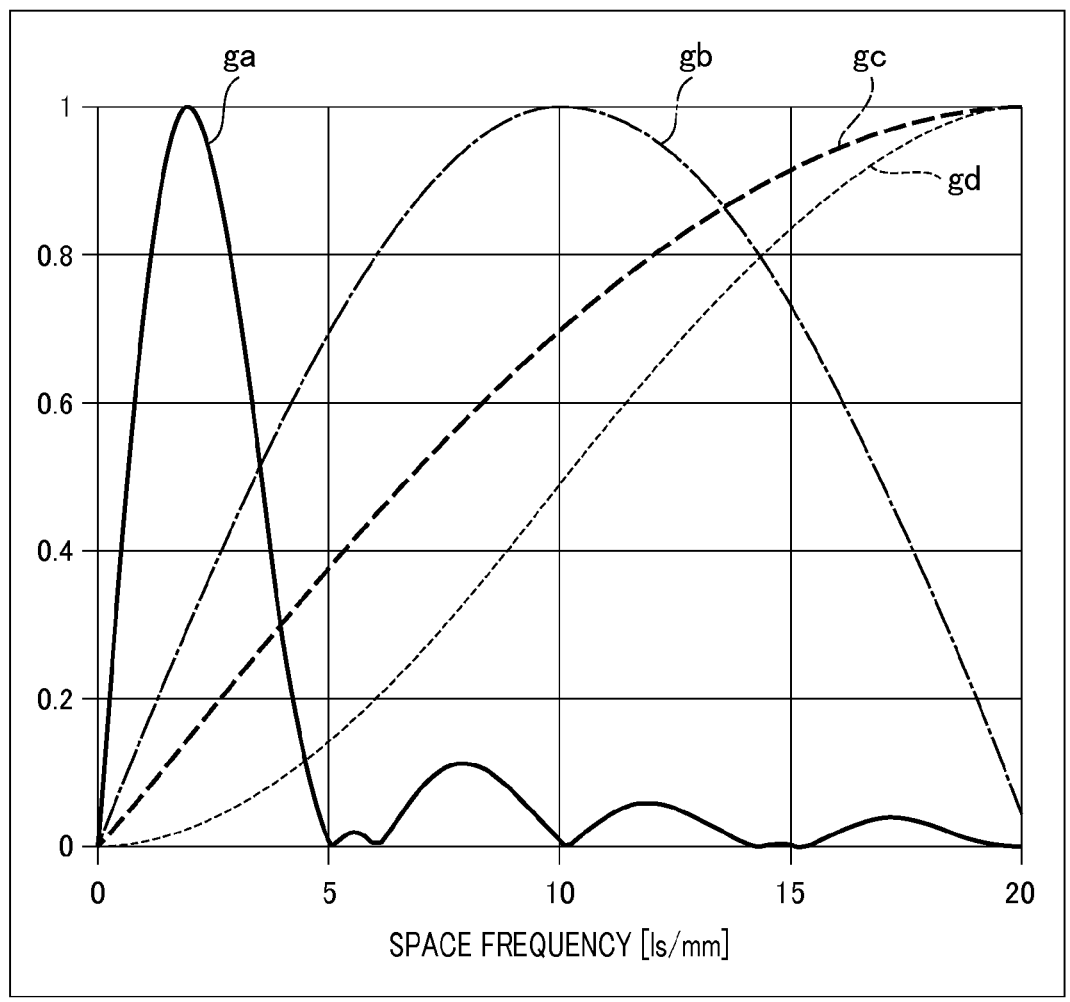
FIG. 8 is a graph illustrating a filter frequency band.

In S130 in FIG. 6, filter processing is performed for the first signal and the third signal. An exemplary passband of the filter processing in the present embodiment is illustrated in the graph ga shown by the solid line in FIG. 8. A space frequency (line·space/mm) is plotted on the horizontal axis, and a gain is plotted on the vertical axis with its maximum value set as 1. In the present embodiment, since the focus detection in a large-defocus state is performed by the first focus detection of the phase difference type, the passband of the filter processing is configured to include a low frequency band. Upon focus adjustment from the large-defocus state to the small-defocus state as necessary, the passband of the filter processing may be adjusted to a higher frequency band as the graph gb shown by the chain-dotted line in FIG. 8 in accordance with the defocus state.

Figure 9A:
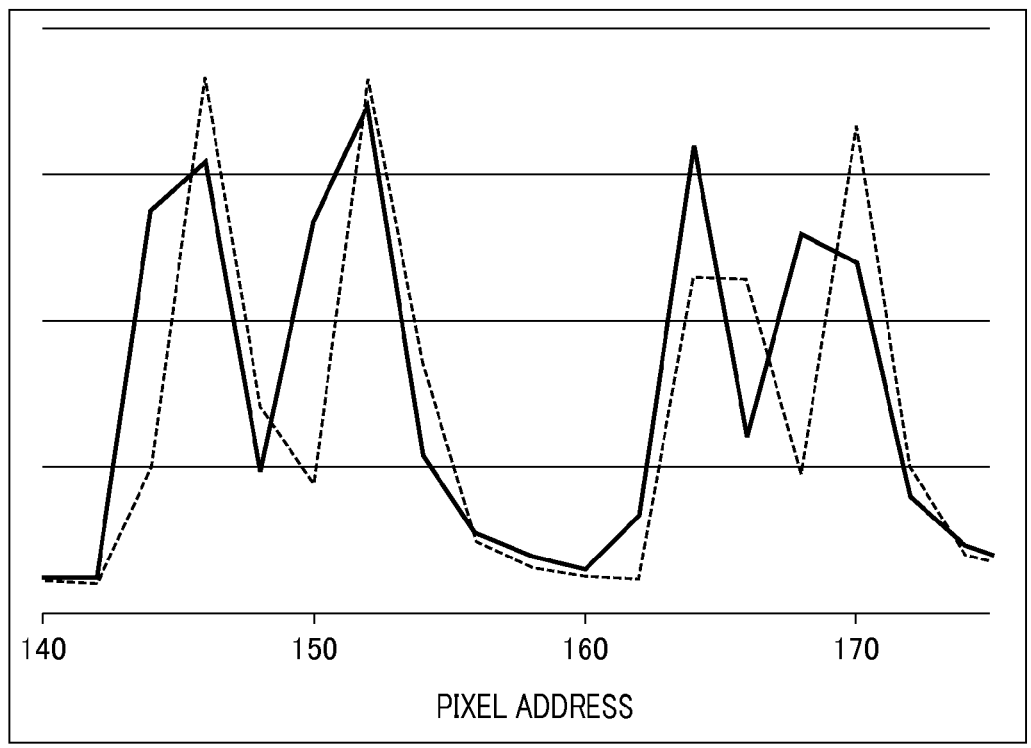
FIG. 9A is a graph illustrating the first and third signals.
Figure 9B:
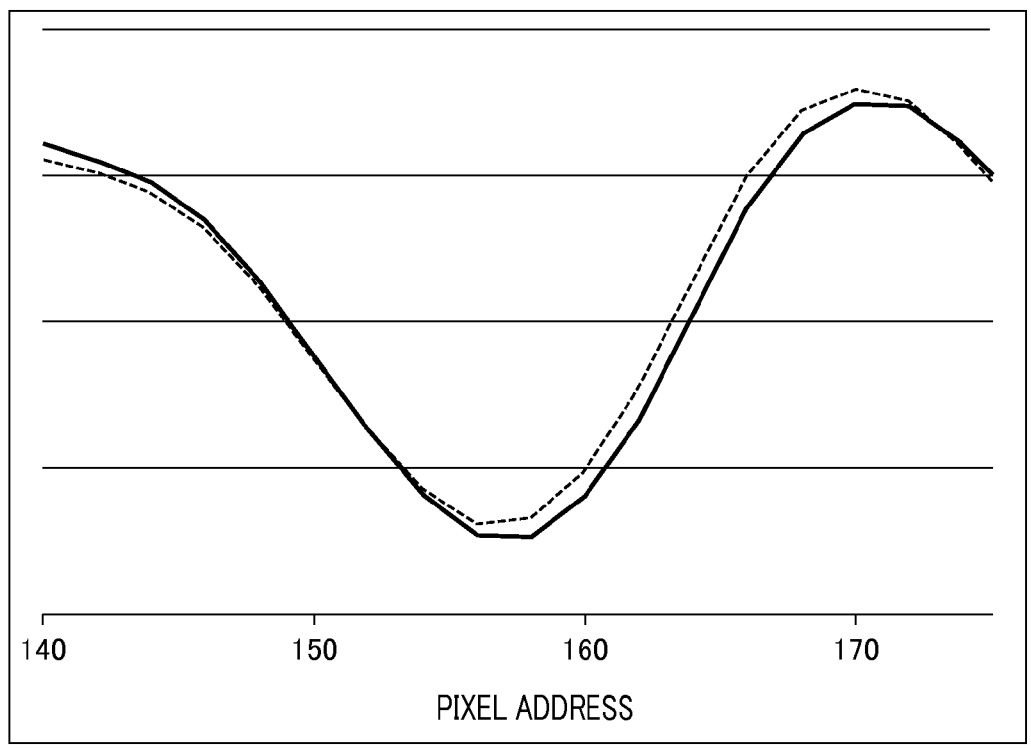
FIG. 9B is a graph illustrating the first and third signals obtained after optical correction processing and filter processing.

FIG. 9A illustrates a first signal (referred to as a broken line) and a third signal (referred to as the solid line) at the best in-focus position of the imaging signal and at the peripheral image height of the imaging element according to the present embodiment. A pixel address corresponding to a pixel position is plotted on the horizontal axis and a signal level is plotted on the vertical axis. FIG. 9B illustrates the first signal (referred to as the broken line) and a third signal (referred to as the solid line) after the optical correction processing and the filter processing.

Next, in S140 of FIG. 6, shift processing for relatively shifting the first signal and the third signal after the filter processing in the pupil division direction is performed. A correlation amount (first evaluation value) representing a degree of match between the first signal and the third signal is calculated by the shift processing.

The kth first signal obtained after the filter processing is denoted by $Gs1(k)$ and the kth third signal obtained after the filter processing is denoted by $Gs2(k)$. The range of the number k corresponding to the focus detection area is denoted by W. When the shift amount by the shift processing is denoted by $s_1$ and its range (shift range) is denoted by $\Gamma 1$, a correlation amount (first evaluation value) COR is calculated by Formula (1):

[Formula (1)]

$$COR(s_1) = \sum_{k \in W} |Gs1(k) - Gs2(k - s_1)|, s_1 \in \Gamma 1 \quad (1)$$

As a result of the shift processing by the shift amount $s_1$, a shift subtraction signal is generated by corresponding and subtracting the kth first signal $Gs1(k)$ and the "$k-s_1$"th third signal $Gs2(k-s_2)$. The absolute value of the generated shift subtraction signal is calculated, a summation from the number 1 to the number k in the range W corresponding to the focus detection area is found and $COR(s_1)$, which is the correlation amount (first evaluation value), is calculated. If required, the correlation amount (first evaluation value) calculated depending on each row may be summed over a plurality of rows depending on each shift amount.

In step S150, processing for calculating a real value shift amount by which the correlation amount becomes a minimum value is executed by sub-pixel computation based on the correlation amount (first evaluation value) to thereby calculate an image shift amount p1. The image shift amount p1 is multiplied by the first conversion coefficient K1 corresponding to the image height of the focus detection area, the F-number of the imaging lens (focusing optical system), and the exit pupil distance to thereby calculate the first detection amount (Def1).

As described above, in the first focus detection of the phase difference type, first detection amount is calculated based on the correlation amount by performing the filter processing and the shift processing for the first signal and the third signal.

Next, a description will be given of a second focus detection of the refocus type according to the present embodiment.

In the second focus detection, a first signal and a second signal are relatively shifted and summed to thereby generate a shift summation signal (refocus signal). The MTF (Modulation Transfer Function) peak position of the imaging signal is calculated by using a contrast evaluation value calculated from the generated refocus signal to thereby calculate a second detection defocus amount. Hereinafter, the second detection defocus amount is referred to as a second detection amount and is denoted by Def2.

Referring to FIG. 10, a description will be given of refocus processing. FIG. 10A is a cross-sectional view schematically illustrating the imaging element, and FIG. 10B is a schematic view illustrating refocus processing. As an example, a description will be given of the refocus processing in a one-dimensional direction (column direction or horizontal direction) using the first signal and the second signal obtained by the imaging element. The imaging plane 800 as shown in FIG. 10A corresponds to the imagine plane 800 as shown in FIG. 5. FIG. 10 schematically shows a first signal of the ith focus detecting pixel in the column direction of the imaging element disposed on the imaging plane 800 as Gs1($i$), and also shows a second signal of the jth imaging pixel in the column direction of the imaging element as G(j), where the symbols i and j are integer variable. In the present embodiment, the relationship "j=i+1" is satisfied. Note that in FIG. 10, the present embodiment is described by using the first pixel Gs1 as the focus detection signal, however, the third pixel Gs2 may be used as the focus detection signal.

In the second focus detection of the refocus type, a pixel row of the imaging element in which the first signal Gs1($i$) and the second signal G(j) are alternately arranged on the imaging plane 800 is used (j=i+1). In a virtual imaging plane 800Im, the position of the ith pixel according to the first signal Gs1($i$) is equal to the position of the jth pixel according to the second signal G(j) (j=i). In the present embodiment, both of the first signal Gs1($i$) and the second signal G(j) become the discrete signals of every other pixel. Also, a virtual pixel shift amount when the imaging plane 800 is replaced to the virtual imaging plane 800Im is denoted by A (corresponding to one pixel), and the correction processing is performed after the calculation in the virtual imaging plane 800Im. The first signal Gs1($i$) is a light-receiving signal of light flux incident to the ith pixel at the chief ray angle $\theta_{GS1}$ corresponding to the partial pupil area 501 shown in FIG. 5A. Also, the second signal G(j) is a light-receiving signal of light flux incident from all of the pupil area corresponding to the partial pupil area 501 and 502, shown in FIG. 5A. Each of the first signal Gs1($i$) and the second signal G(j) has not only light intensity distribution information but also incident angle information. Therefore, the first signal Gs1($i$) is translationally moved from the virtual imaging plane 800Im to a virtual imaging plane 810Im along the direction of the angle $\theta_{Gs1}$. Also, the second signal G(j) includes a light-receiving signal of the light flux incident to the jth pixel at the chief ray angle $\theta_{Gs2}$ corresponding to the partial pupil area 503 shown in FIG. 5A. Therefore, the second signal G(j) is translationally moved from the virtual imaging plane 800Im to the virtual imaging plane 810Im along the direction of the angle $\theta_{Gs2}$. The translationally moved signals can be summed to generate a refocus signal on the virtual imaging plane 810Im. Also, a refocus signal on a virtual imaging plane 820Im can be generated by translationally moving the second signal from the virtual imaging plane 810Im to the virtual imaging plane 820Im.

A translational movement of the first signal Gs1($i$) from the virtual imaging plane 800Im to the virtual imaging plane 810Im along the direction of the angle $\theta_{GS1}$ corresponds to a +0.5 pixel shift in the column direction. Also, a translation movement of the second signal G(j) from the virtual imaging plane 800Im to the virtual imaging plane 810Im along the direction of the angle $\theta_{GS2}$ corresponds to a −0.5 pixel shift in the column direction. Thus, the first signal Gs1($i$) and the second signal G(j) are relatively shifted by +2 pixels, and then Gs1($i$) and G(j+2) are correspondingly summed so that the refocus signal on the virtual imaging plane 810 can be generated. Also, the first signal Gs1($i$) and the second signal G(j) are shifted by the integer pixel shift and then summed so that a shift summation signal (refocus signal) on each virtual imaging plane corresponding to the integer shift amount can be generated. Thereby, a contrast evaluation value is calculated from the generated shift summation signal (refocus signal). The MTF peak position of the imaging signal is calculated from the calculated contrast evaluation value to thereby acquire a second detection amount DEF2.

Referring to a flowchart in FIG. 11, a description will be given of second focus detection processing. The present processing is performed by a focus detection signal generating unit, which is realized by controlling the imaging element 107 and the image processing circuit 125 in accordance with the program executed by the CPU 121.

In S210, processing for setting a focus detection area performing focus adjustment within an effective pixel area of the imaging element 107 is carried out. In the focus detection area, the focus detection signal generating unit generates a first signal based on the light-receiving signal (image-A signal) of the first pixel, and generates a second signal from the light-receiving signal (imaging signal) of the second pixel.

In S220, filter processing is performed for the first signal and the second signal. An exemplary passband of the filter processing in the present embodiment is illustrated in the graph gc shown by the broken line and the graph gd shown by the dot line in FIG. 8. In the present embodiment, focus detection is performed from the small-defocus state to the vicinity of the best in-focus position by the second focus detection of the refocus type. Thus, the filter characteristics are set such that the passband of the filter processing includes a higher frequency band than the passband of the filter processing in the first focus detection. If required, a Laplacian-type (second order derivative type) [1, −2, 1] filter may also be used for edge extraction of an object imaging signal by the present filter processing. In this case, as shown by the graph gd shown by the dotted line in FIG. 8, the passband of the filter processing can be set to a higher frequency band. The second focus detection is performed by extracting the high frequency component of the object image, resulting in an improvement in focus detection accuracy.

Figure 11:
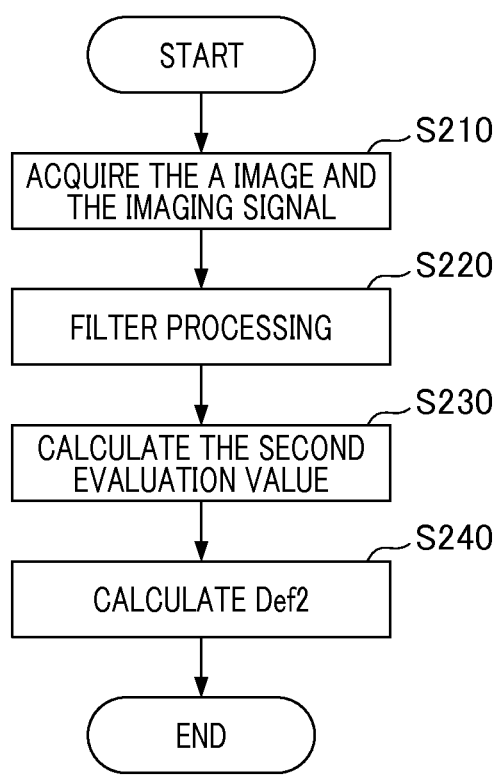
FIG. 11 is a flowchart illustrating second focus detection processing.

In S230 of FIG. 11, processing for relatively shifting the first signal and the second signal after the filter processing in the pupil division direction is performed and the shifted signals are summed to thereby generate a shift summation signal (refocus signal). From the magnitude of the generated shift summation signal, a contrast evaluation value (second evaluation value) that is determined by the computing formula is calculated. The kth first signal after the filter processing is denoted by $Gs1(k)$ and the kth second signal after the filter processing is denoted by $G(k)$. The range of the number k corresponding to the focus detection area is denoted by W. Also, in the present embodiment, since the second signal $G(k)$, which is the imaging signal, has a light-receiving unit with an area larger than that of the first signal $Gs1(k)$, which is the focus detection signal, light receiving amounts of the both signals are different from each other. Therefore, processing is carried out that normalizes the second signal $G(k)$ in accordance with the light-receiving area ratio. The second signal after the normalizing processing is denoted by $G^N(k)$. When the shift amount by the shift processing is denoted by $s_2$, and its range (shift range) is denoted by $\Gamma 2$, a contrast evaluation value (second evaluation value) RFCON is calculated by Formula (2):

[Formula (2)]

$$RFCON(s_2) = \max_{k \in W} |Gs1(k) + G^N(k - s_2)|, s_2 \in \Gamma 2 \qquad (2)$$

As a result of the shift processing by the shift amount $s_2$, a shift summation signal is generated by associating and summing the kth first signal $Gs1(k)$ and the "$k-s_2$"th normalized second signal $G^N(k-s_2)$. An absolute value of the generated shift summation signal is calculated, and the maximum value thereof is taken in the range W corresponding to the focus detection area so that $RFCON(s_2)$ is calculated as the contrast evaluation value (second evaluation value). If required, the contrast evaluation value (second evaluation value) calculated depending on each row may be summed over a plurality of rows depending on each shift amount.

In S240, from the contrast evaluation value (second evaluation value), a real value shift amount p by which the contrast evaluation value becomes a maximum value is calculated by the sub-pixel computation. In the second focus detection of the refocus type, a calculation for the first pixel $Gs1(i)$ and the second pixel $G(j)(j=i)$ is executed on the virtual imaging plane 800Im, instead of that for the first pixel $Gs1(i)$ and the second pixel $G(j)$ $(j=i+1)$ on the imaging plane 800 in FIG. 10. Thereby, the real value shift amount by which the contrast evaluation value on the virtual imaging plane 800Im becomes the maximum value is acquired by the calculated shift amount p. Therefore, when the virtual imaging plane 800Im is replaced to the imaging plane 800, the shift amount that corrects the virtual pixel shift amount A of the first pixel $Gs1(i)$ and the second pixel $G(j)$ is calculated as a peak shift amount $p2(=p+\Delta)$. The peak shift amount p2 is multiplied by the second conversion coefficient K2 corresponding to the image height of the focus detection area, the F-number of the imaging lens (focusing optical system), and the exit pupil distance to thereby calculate a second detection amount (Def2).

As described above, in the second focus detection of the refocus type, the filter processing and the shift processing are performed for the first signal and the second signal, which are the imaging elements. Subsequently, the processed signals are summed to thereby generate a shift summation signal. A second detection amount is acquired from the contrast evaluation value determined from the magnitude of the shift summation signal. In other words, in the second focus detection of the refocus type, focus detection is performed by using the shift summation signal (refocus signal) from the first signal and the normalized second signal that are acquired at the adjacent position, in contrast to the first focus detection of the phase difference type using the first pixel and the third pixel spaced apart from each other. Thereby, the shift summation signal and the imaging signal may be substantially identically affected by the aberrations (spherical aberration, astigmatism, coma aberration, and the like) of the focusing optical system since the light flux corresponding to the shift summation signal substantially matches the light flux corresponding to the second signal, which is the imaging signal. Thus, the in-focus position (position where the second detection amount becomes 0) calculated by the second focus detection can substantially match the best in-focus position of the imaging signal (the MTF peak position of the imaging signal) to realize the focus detection with high precision.

Figure 12A:
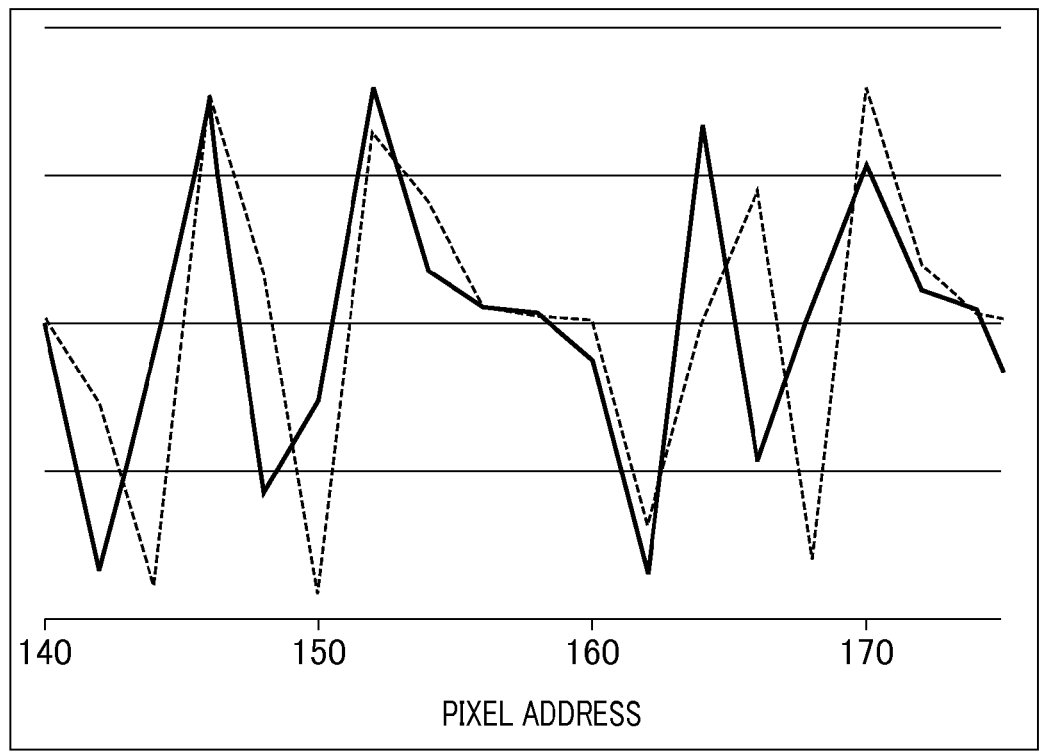
FIG. 12A is a graph illustrating the first and second signals obtained after the filter processing.
Figure 12B:
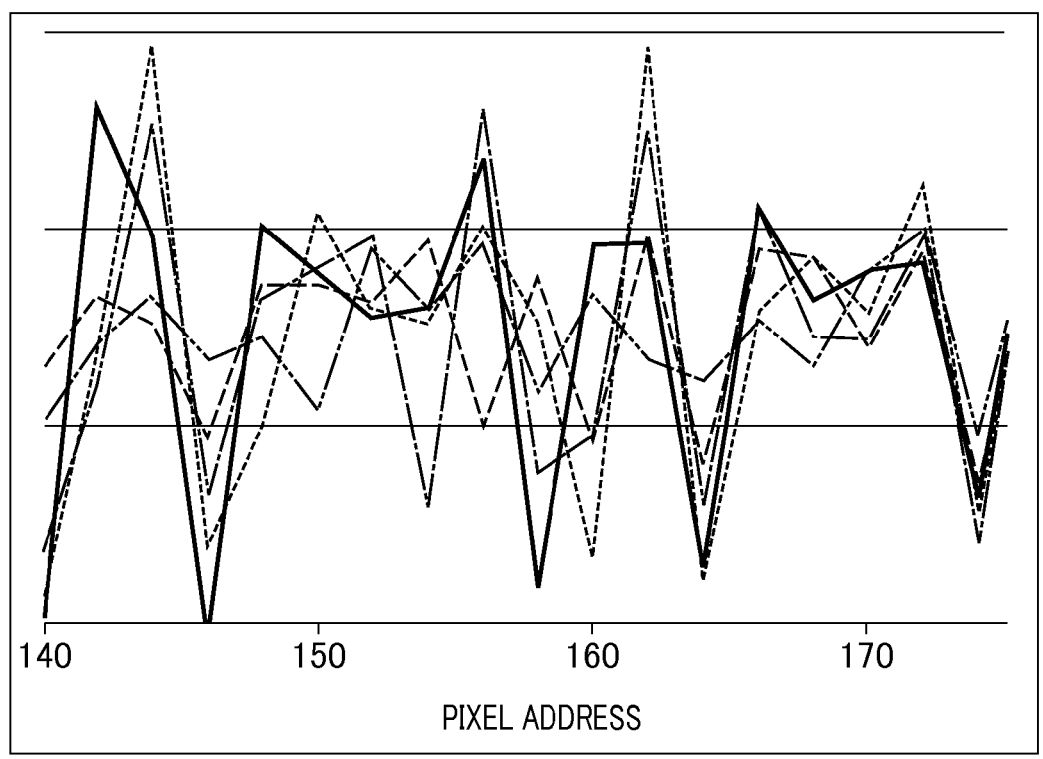
FIG. 12B is a graph illustrating the first and second signals after performing shift summation.
Figure 13:
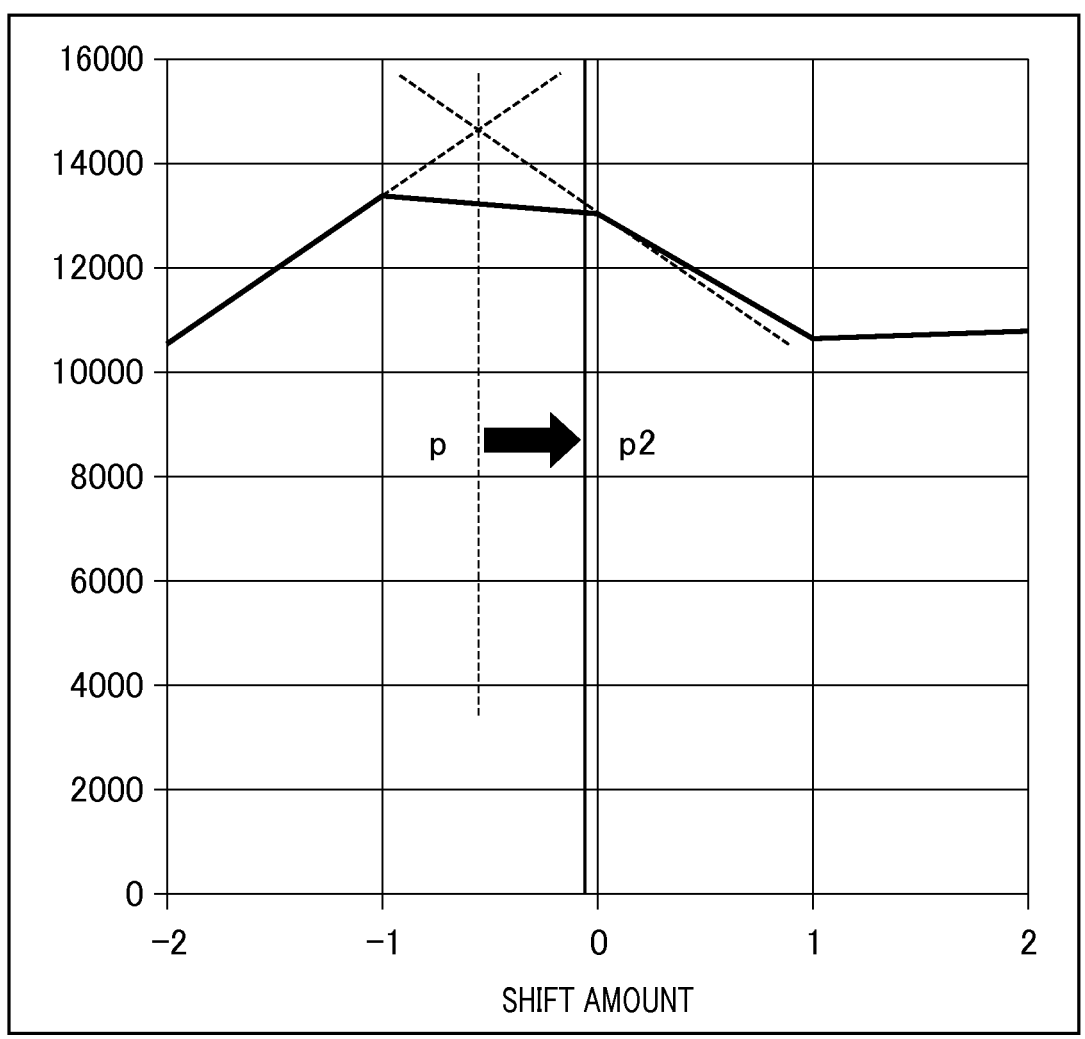
FIG. 13 is a graph illustrating a second evaluation value.

FIG. 12A illustrates the first signal (broken line) and the normalized second signal (solid line) after the filter processing. A pixel address corresponding to the pixel position is plotted on the horizontal axis, and a signal level is plotted on the vertical axis. Also, a shift summation signal (refocus signal) summed by relatively shifting the first signal (broken line) and the normalized second signal (solid line) after the filter processing by the shift amount of −2, −1, 0, 1 and 2 and summing the shifted signals, is shown in FIG. 12B. It can be seen that the peak value of the shift summation signal varies in accordance with a change in the shift amount. A contrast evaluation value (second evaluation value) calculated based on each of the shift summation signals are shown in FIG. 13. The shift amount is plotted on the horizontal axis and the contrast evaluation value is plotted on the vertical axis. Referring to FIG. 13, it can be seen that the shift amount (difference) between the calculated peak shift amount p2 and the shift amount 0, which is the best in-focus position, is less suppressed to enable detecting the focus with high precision.

Figure 14:
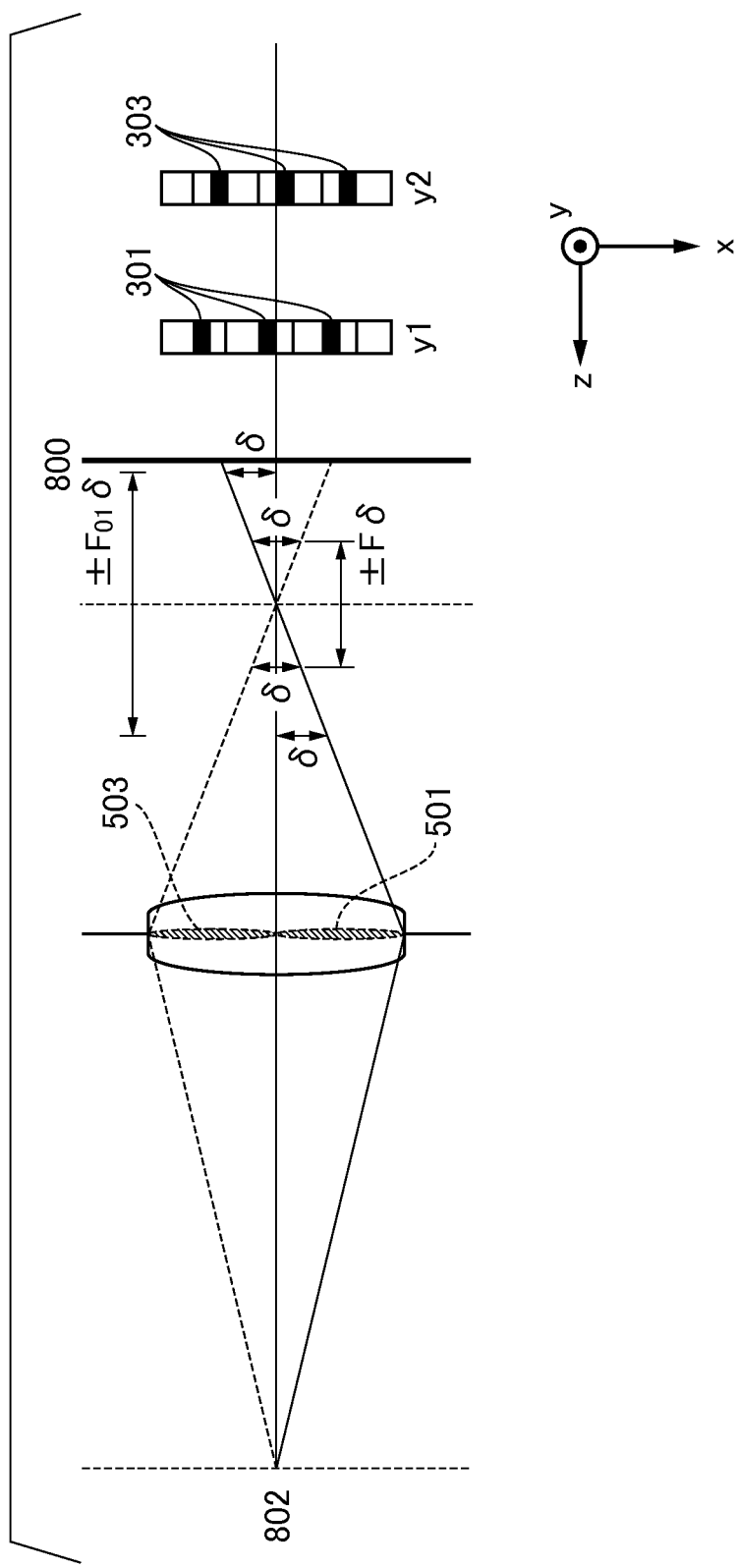
FIG. 14 is a schematic explanatory view illustrating a refocusable range.

In contrast, the range of the defocus amount in which the second focus detection of the refocus type can detect the focus with the high precision is limited since the refocusable range has a limit. Referring to FIG. 14, a description will be given of refocusable range according to the present embodiment. In FIG. 14, the y direction is set in a direction perpendicular to the sheet, and the z direction is set in a horizontal direction orthogonal to the y direction, and the x direction is set in a vertical direction orthogonal to the z direction.

When an allowable confusion circle diameter is denoted by δ and an aperture value of the focusing optical system is denoted by F, a depth of field at the aperture value F is $\pm F \times \delta$. In the light-receiving unit of the present embodiment, F is set to be divided as $1/N_H(=\frac{1}{2})$ in the horizontal direction and $1/N_v(=1)$ in the vertical direction. The effective aperture value $F_{01}$ (or $F_{03}$) in the horizontal direction of the partial pupil area 501 (or 503), of which the surface becomes narrow, is set as $F_{01}=N_H \times F$ (or $F_{02}=N_H \times F$) and then, the area becomes dark. An effective depth of field for each first signal (or third signal) becomes $N_H$ times the depth by $\pm N_H \times F \times \delta$, and the in-focus range is spread over $N_H$ times. An object image, which is in-focus depending on the first signal (or third signal), is acquired within the range of the effective depth of field "$\pm N_H \times F \times \delta$". Thus, the in-focus position can be re-adjusted (refocus) after shooting by the refocus processing for translationally moving the first signal (or the third signal) along the chief ray angle $\theta_{GS1}$ (or $\theta_{GS2}$) shown in FIG. 10. Thus, the adjustment defocus amount dm based on the imaging plane that can re-adjust (refocus) the in-focus position after the shooting is substantially in the range of Formula (3):

[Formula (3)]

$$|dm| \leq N_H \times F \times \delta \quad (3)$$

The range of the defocus amount which enables detecting the focus with a high precision in the second focus detection of the refocus type is substantially limited in the range of Formula (3). The defocus range in which the second focus detection can detect the focus with a high precision is in the range less than or equal to the defocus range in which the first focus detection of the phase difference type can detect the focus. Thus, the shift range in the shift processing of the second focus detection of the refocus type is configured to be less than or equal to the shift range in the shift processing of the first focus detection of the phase difference type.

In the focus detection of the present embodiment, the first focus detection is performed in the focus adjustment from the large defocus state to the small-defocus state in the focusing optical system, and the second focus detection is performed in the focus adjustment from the small-defocus state to the vicinity of the best in-focus position. The passband of the filter processing in the second focus detection includes the higher frequency band than that of the filter processing in the first focus detection. Also, in the imaging element of the present embodiment, the light flux light-received by the focus detecting pixels (the first pixel and the third pixel) is different from that of the light received by the imaging pixel (second pixel). In other words, the effect on the focus detecting pixel due to each aberrations (spherical aberration, astigmatism, coma aberration, and the like) of the focusing optical system can be different from that on the imaging signal. The difference of the effect therebetween becomes large if the aperture value of the focusing optical system is small (bright). Therefore, when the aperture value of the focusing optical system is small (bright), there can be a difference between the in-focus position calculated by the first focus detection of the phase difference type (the position where the first detection amount becomes 0) and the best in-focus position of the imaging signal. The best in-focus position of the imaging signal corresponds to the peak position of the MTF of the imaging signal. Thus, in particular, if the aperture value of the focusing optical system is less than or equal to a predetermined aperture value, the precision of the focus detection in the first focus detection of the phase difference type can be reduced. Accordingly, if the aperture value of the focusing optical system is less than or equal to the predetermined aperture value, preferably, the second detection amount acquired by the second focus detection of the refocus type is used as necessary, in addition to the first focus detection of the phase difference type to perform the focus detection with a high precision. Also, in the second focus detection, the final in-focus position can be detected basically without driving the lens to thereby suppress troublesome lens driving, a focus shake of a live view image and the like, such as a contrast evaluation AF by the previous imaging element signal.

Figure 15:
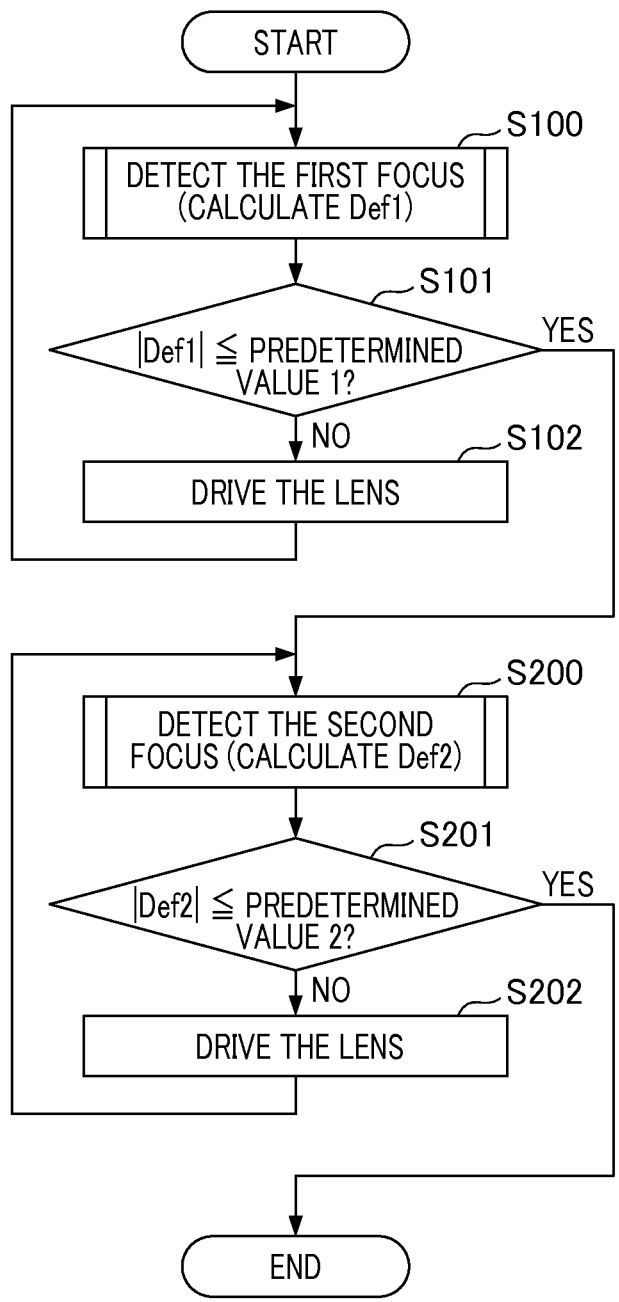
FIG. 15 is a flowchart illustrating focus detection processing.

FIG. 15 is a flowchart illustrating a flow of focus detection processing according to the present embodiment. In the focus detection processing of the present flow, for example, the imaging apparatus is set as any photographing mode, and processes the signals from the imaging element 107 one by one. The above processing is performed during a live view display for displaying the display image by using the display unit 131. The present focus detection processing may be repeated during the live view display, and performed depending on the imaging preparation instructions using the operation unit 132 (AF, AE and the like with the half-pressed button), the imaging instructions, and the like. The present processing is realized according to the program executed by the CPU 121. In the present embodiment, the first focus detection of the phase difference type is executed until the absolute value of the first detection amount Def1 is less than or equal to a first threshold (referred to as a "predetermined value 1") to thereby drive the focus lens. Thereby, the focus adjustment is performed from the large-defocus state to the small-defocus state of the focusing optical system. Subsequently, the second focus detection of the refocus type is executed until the absolute value of the second detection amount Def2 is less than or equal to a second threshold (referred to as a predetermined value 2, wherein the predetermined value 2<the predetermined value 1) to thereby drive the focus lens. Thereby, the focus adjustment is performed from the small-defocus state to the vicinity of the best in-focus position of the focus optical system.

When the processing in FIG. 15 is started, the iterative processing from S100 to S102 is executed. In other words, the processing of S100 and S102 is repeatedly executed if the judging condition in step S101 is not met. In S100, the first detection amount (Def1) is acquired based on the result of the first focus detection by the phase difference type. In S101, the magnitude |Def1| of the first detection amount (Def1) is compared with the predetermined value 1. If |Def1| is greater than the predetermined value 1, the processing proceeds to S102, whereas if |Def1| is equal to or less than the predetermined value 1, the processing shifts to S200. In S102, the focus lens is driven in accordance with the first detection amount (Def1), and the processing returns to S100.

If the judging condition in S201 is not met, the processing of S200 and S202 is executed as the iterative processing. In S200, the second detection amount (Def2) is acquired based on the second focus detection by the refocus type. In S201, the magnitude |Def2| of the second detection amount (Def2) is compared with the predetermined value 2 (<the predetermined value 1). If |Def2| is greater than the predetermined value 2, the processing proceeds to S202, whereas if |Def2| is less than or equal to the predetermined value 2, the focus adjustment operation is completed. In S202, the focus lens is driven in accordance with the second detection amount (Def2), and the processing returns to S200.

In the present embodiment, the first focus detection is executed followed by the second focus detection. If the first detection amount is greater than the first threshold, the focus adjustment operation is performed by using the first detection amount. If the first detection amount is less than or equal to the first threshold, the focus adjustment operation is performed by using the second detection amount by the second focus detection, and the focus adjustment operation is continued until the second detection amount is less than or equal to the second threshold. According to the present embodiment, the difference between the in-focus position calculated based on the focus detection signal and the best in-focus position of the imaging signal can be suppressed to realize the focus detection with high precision.

Second Embodiment

Next, a description will be given of a second embodiment of the present invention. In the second embodiment, the same reference numerals already used are used for the same components as those in the first embodiment, and thus, a detailed description thereof will be omitted. Hereinafter, a description will be given of focus detection processing which is different from the first embodiment.

Figure 16:
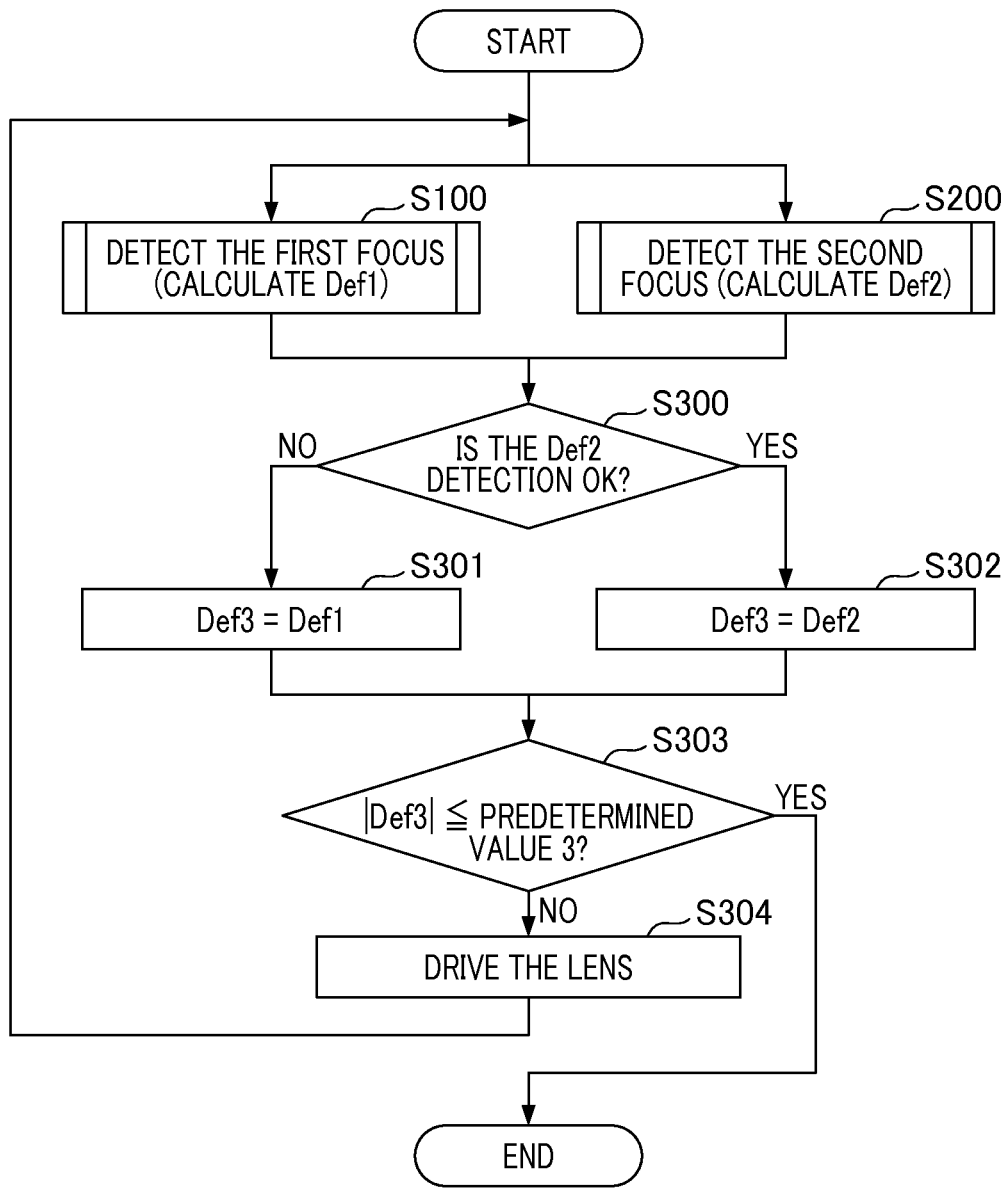
FIG. 16 is a flowchart illustrating focus detection processing according to a second embodiment of the present invention.

Referring to a flowchart in FIG. 16, a description will be given of a flow of focus detection processing according to the present embodiment. The present processing is realized according to the program executed by the CPU 121. In the present embodiment, the first focus detection of the phase difference type and the second focus detection of the refocus type are processed in parallel to enable realizing the high-speed processing. If the judging condition in S303 is not met, S100, S200, S300, S301, S302, and S304 as shown in FIG. 16 are executed as the iterative processing.

The processing of S100 and S200 is executed as the parallel processing. In other words, in S100, the first focus detection by using the phase difference method is executed to thereby calculate the first detection amount (Def1). In S200 executed in parallel with S100, the second detection amount (Def2) determined based on the contrast evaluation value is calculated by the second focus detection of the refocus type. After the processing of S100 and S200, the processing proceeds to S300. S300 is processing for determining whether or not the second detection amount (Def2) is acquired in the shift range by the shift processing. As a result of the determination, if the second detection amount (Def2) is acquired, the processing proceeds to S302, whereas, if the second detection amount (Def2) is not acquired, the processing proceeds to S301.

In S302, processing for setting the second detection amount (Deg2) as a third detection defocus amount (hereinafter, referred to as a "third detection amount", and denoted by "Def3") is performed. Also, in S301, processing for setting the first detection amount (Def1) as the third detection amount (Def3) is performed. After the processing of S301 and S302, the processing proceeds to S303. In S303, the magnitude |Def3| of the third detection amount (Def3) is compared with a third threshold (denoted by a predetermined value 3). For example, the predetermined value 3 is equal to the predetermined value 2. If the third detection amount (Def3) is greater than the predetermined value 3, the processing proceeds to S304, whereas, if the third detection amount (Def3) is less than or equal to the predetermined value 3, the focus adjustment operation is completed. In S304, the focus lens is driven in accordance with the third detection amount (Def3). Subsequently, the processing returns to the parallel processing of S100 and S200.

In the present embodiment, the parallel processing of the first focus detection and the second focus detection is executed. If the second focus detection amount is acquired in the second focus detection, the second focus detection amount is used as the third detection amount. If the second detection amount is not acquired in the second focus detection, the first detection amount is used as the third detection amount. The focus adjustment operation using the third detection amount is continued until the third detection amount is less than or equal to the third threshold. Accordingly, the present embodiment can perform the high-speed focus detection with the high precision as the first embodiment by the parallel processing of the first focus detection processing and the second focus detection processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-067965, filed Mar. 28 2014, and Japanese Patent Application No. 2015-048201, filed Mar. 11, 2015, which are hereby incorporated by reference wherein in their entirety.

What is claimed is:

1. An imaging apparatus comprising:
an imaging element with a first pixel for receiving light flux passing through a partial pupil area in a focusing optical system and a second pixel for receiving the light flux passing through a pupil area that includes the partial pupil area;
a signal generating unit configured to generate a first signal based on a signal received by the first pixel and generate a second signal based on a signal received by the second pixel; and
a controlling unit configured to control focus adjustment operation of the focusing optical system by using the first signal and the second signal,
wherein the controlling unit calculates a contrast evaluation value determined based on a shift summation signal obtained by performing shift processing for the first signal and the second signal and summing the shift-processed first signal and the second signal for a plurality of shift amounts, and controls the focus adjustment operation by using a detection amount determined based on the contrast evaluation value.

2. The imaging apparatus according to claim 1,
wherein the controlling unit relatively shifts the first signal and the second signal in a pupil division direction according to a pupil division of the partial pupil area in the shift-processing.

3. The imaging apparatus according to claim 2,
wherein the controlling unit acquires an absolute value of a value obtained by summing the first signal and the second signal corresponding to the shift amount, and calculates a value as the contrast evaluation value such that the absolute value is a maximum value in a range of focus detection.

4. The imaging apparatus according to claim 3,
wherein the detection amount is determined based on a maximum value of the contrast evaluation value calculated by changing the shift amount.

5. The imaging apparatus according to claim 1,
wherein the second pixel is used as a signal for image recording.

6. The imaging apparatus according to claim 1,
wherein the imaging element has the first pixel for receiving light flux passing through a first partial pupil area in the focusing optical system and a third pixel for receiving light flux passing through a second partial pupil area of the focusing optical system, which is different from the first partial pupil area,
wherein the controlling unit calculates a correlation amount between the first signal and a third signal generated by the signal generating unit based on a signal received by the third pixel in a first focus detection, and controls the focus adjustment operation by using a first detection amount obtained based on the correlation amount, and controls the focus adjustment operation by using a second detection amount determined based on the contrast evaluation value in a second focus detection.

7. The imaging apparatus according to claim 6,
wherein, if the first detection amount is greater than a first threshold, the controlling unit controls the focus adjustment operation by using the first detection amount, and if the first detection amount is less than or equal to the first threshold, the controlling unit controls the focus adjustment operation by using the second detection amount, and continues the focus adjustment operation until the second detection amount is less than or equal to a second threshold.

8. The imaging apparatus according to claim 7, wherein the second threshold is less than the first threshold.

9. The imaging apparatus according to claim 6, wherein the controlling unit executes parallel processing of the first focus detection and the second focus detection, and if the second detection amount is acquired in the second focus detection, sets the second detection amount as a third detection amount, and if the second detection amount is not acquired in the second focus detection, sets the first detection amount as the third detection amount to control the focus adjustment operation by using the third detection amount.

10. The imaging apparatus according to claim 9, wherein the controlling unit continues the parallel processing of the first focus detection and the second focus detection until the third detection amount is less than or equal to a third threshold.

11. A control method to be executed by an imaging apparatus that includes an imaging element with a first pixel for receiving light flux passing through a partial pupil area in a focusing optical system and a second pixel for receiving the light flux passing through a pupil area which includes the partial pupil area, and a signal generating unit configured to generate a first signal based on a signal received by the first pixel and generate a second signal based on a signal received by the second pixel, and a controlling unit configured to control focus adjustment operation of the focusing optical system by using the first signal and the second signal, the method comprising:

generating a plurality of shift summation signals acquired by performing shift processing for the first signal and the second signal, and summing the shift processed first signal and the second signal for a plurality of shift amounts;

respectively calculating each contrast evaluation value from magnitude of the plurality of the shift summation signals and determining a detection amount based on the contrast evaluation value; and controlling the focus adjustment operation by using the detection amount.

* * * * *